(12) United States Patent
Lewis et al.

(10) Patent No.: US 8,364,446 B2
(45) Date of Patent: Jan. 29, 2013

(54) APPROXIMATING A SYSTEM USING AN ABSTRACT GEOMETRICAL SPACE

(75) Inventors: James M. Lewis, Austin, TX (US);
Michael D. Cerna, Austin, TX (US);
Kyle P. Gupton, Austin, TX (US);
James C. Nagle, Austin, TX (US); Yong Rao, Round Rock, TX (US);
Subramanian Ramamoorthy, Edinburgh (GB); Darren R. Schmidt, Cedar Park, TX (US); Bin Wang, Shanghai (CN); Benjamin R. Weidman, Austin, TX (US); Lothar Wenzel, Round Rock, TX (US); Naxiong Zhang, Shanghai (CN)

(73) Assignee: National Instruments Corporation, Austin, TX (US)

( * ) Notice: Subject to any disclaimer, the term of this patent is extended or adjusted under 35 U.S.C. 154(b) by 580 days.

(21) Appl. No.: 12/577,357

(22) Filed: Oct. 12, 2009

(65) Prior Publication Data
US 2011/0087468 A1 Apr. 14, 2011

(51) Int. Cl.
*G06F 17/10* (2006.01)
(52) U.S. Cl. ............... 703/2; 700/94; 700/83; 700/42
(58) Field of Classification Search .......... 717/113, 717/174, 105, 114; 382/159, 154; 700/18, 700/94, 83, 42; 703/113, 174, 105, 114
See application file for complete search history.

(56) References Cited

U.S. PATENT DOCUMENTS

| | | | |
|---|---|---|---|
| 7,035,694 B2* | 4/2006 | Ramamoorthy et al. | 700/18 |
| 2003/0031357 A1* | 2/2003 | Wenzel et al. | 382/154 |
| 2004/0143830 A1* | 7/2004 | Gupton et al. | 717/174 |
| 2005/0028138 A1* | 2/2005 | Case et al. | 717/113 |
| 2006/0039601 A1* | 2/2006 | Nair et al. | 382/159 |
| 2008/0066053 A1* | 3/2008 | Ramamoorthy et al. | 717/114 |
| 2009/0241089 A1* | 9/2009 | Ramamoorthy et al. | 717/105 |

OTHER PUBLICATIONS

Stephen Lindemann, Anna Yershova, Steven LaValle Incremental Grid Sampling Strategies in Robotics, Algorithmic Foundations of Robotics VI, STAR 17, pp. 313-328, 2005.*

(Continued)

*Primary Examiner* — Omar Fernandez Rivas
*Assistant Examiner* — Cuong Luu
(74) *Attorney, Agent, or Firm* — Meyertons Hood Kivlin Kowert & Goetzel, P.C.; Jeffrey C. Hood; Mark S. Williams

(57) ABSTRACT

System and method for approximating a system. A multi-parameter representation of a family of systems is stored. An embedding of the family into an abstract geometrical continuous space with a metric and defined by the parameters is determined. Coordinates of the space specify values for the parameters of systems of the family. The space includes a grid of points representing respective discrete approximations of the systems. A first point corresponding to a desired instance of a system is determined. The first point's coordinates specify values for the parameters of the instance. The space is sampled using a mapping of a well-distributed point set from a Euclidean space of the parameters to the abstract space. A nearest discrete point to the first point is determined which specifies values for parameters for an optimal discrete approximation of the desired instance, which are useable to implement the discrete approximation of the desired instance.

34 Claims, 11 Drawing Sheets

OTHER PUBLICATIONS

Subramanian Ramamoorthy, Benjamin Kuipers Parametrization and Computations in Shape Spaces with Area and Boundary Invariants, Fall Workshop on Computational and Combinatorial Geometry, Nov. 2006.*

Wolf Kohn, Vladimir Brayman, Pawel Cholewinski Control in Hybrid Systems Journal of Hybrid, 2003.*

S. Ramamoorthy, L. Wenzel, J. Nagle, B. Wang, and M. Cerna; "A Differential Geometric Approach to Discrete-Coefficient Filter Design"; IEEE Asilomar Conference on Signals, Systems, and Computers; Oct. 26-29, 2008; 4 pages.

K. Dhamdhere; "Approximation Algorithms for Metric Embedding Problems"; School of Computer Science, Computer Science Department, Carnegie Mellon University, Pittsburgh, PA; Ph.D. Thesis submitted on Jun. 25, 2005; 15 pages.

* cited by examiner

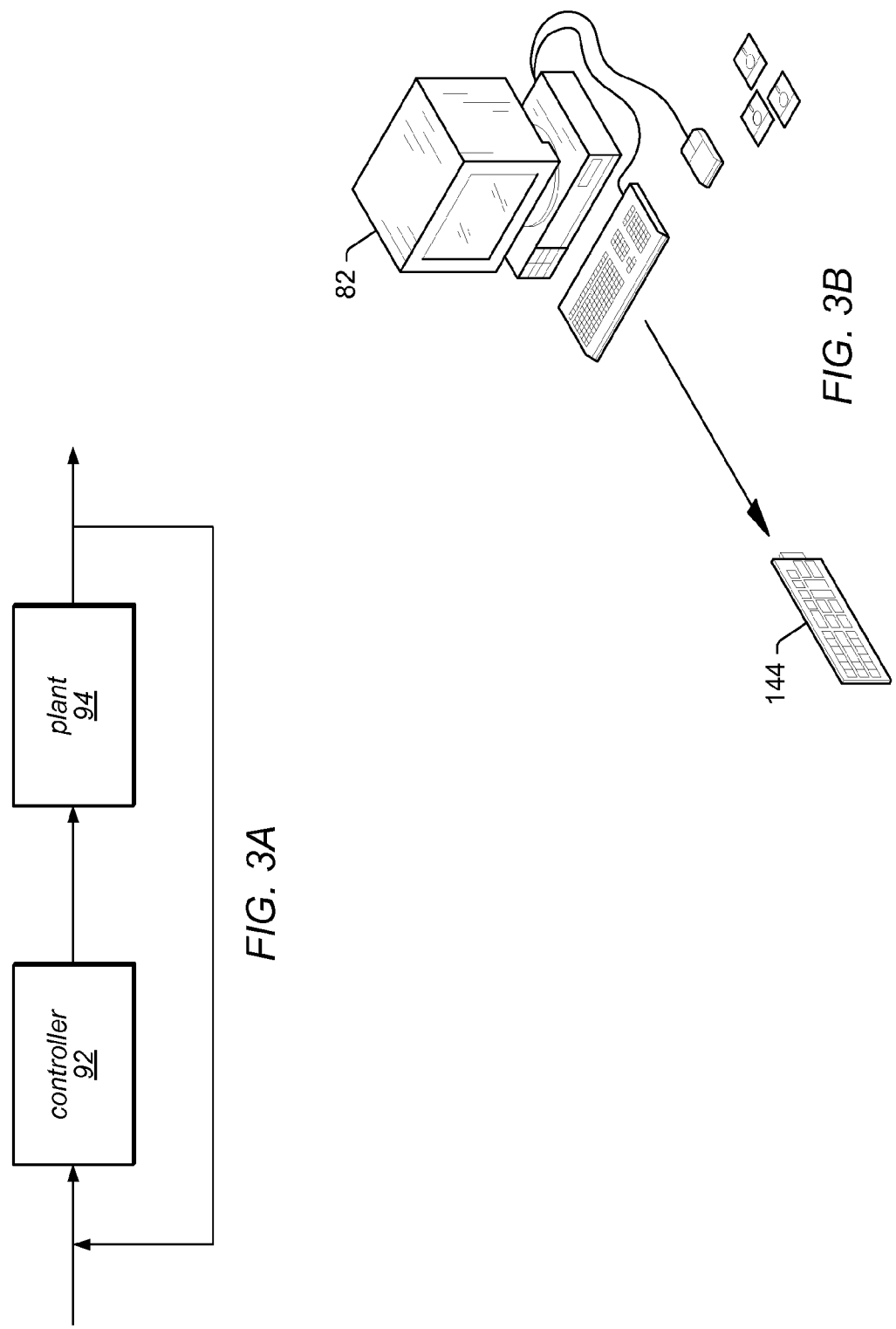

APPROXIMATING A SYSTEM USING AN ABSTRACT GEOMETRICAL SPACE

FIELD OF THE INVENTION

The present invention relates to the field of optimization, and more particularly to a system and method for discrete approximation of a system using an abstract geometrical space.

DESCRIPTION OF THE RELATED ART

Many systems, e.g., filters, programs, circuits, machines, and networks, among others, have interdependent aspects or parameters that make design or optimization of the systems difficult. Such interdependencies may be complex and highly nonlinear, and so naïve optimization approaches that assume that linear proximity of parameter values corresponds to linear proximity of system behaviors may not be appropriate.

More generally, the notions of distance between linear systems, computations of near neighbors and paths between them that minimize the distance in a suitable sense are fundamental to a variety of problems in system theory. In practice, design techniques do not always pay attention to this underlying geometric structure. For instance, in the problem of discrete-coefficient filter design, one tries to minimize a cost function that includes a penalty for deviation from a desired frequency response, and perhaps a few other terms. A naïve approach that generates a discrete-coefficient filter by rounding coefficients of a corresponding infinite-precision design is rarely of sufficient quality. However, more systematic design methods based on optimization face the problem of dealing with a multimodal cost function over a discretized domain, which represents significant computational complexity.

Thus, improved systems and methods for discrete approximation of systems are desired.

SUMMARY OF THE INVENTION

Various embodiments of a system and method for discrete approximation of a system using an abstract geometrical space are presented.

First, a representation of a family of systems may be stored in a computer memory. The representation of the family of systems may include a plurality of parameters, and the family of systems may be or include models of corresponding real-world systems. For example, in some embodiments, the systems may be filters and the parameters may be or include coefficients for various filter designs, e.g., finite impulse response (FIR) or infinite impulse response (IIR) filters. In these embodiments, the representation may be or include analytic expressions, such as rational polynomials representing the gain/frequency response of the filters.

Note, however, that other embodiments may be directed to a wide range of other systems, e.g., proportional/integral/derivative (PID) controllers, single input/single output (SISO) systems, multi-input/multi-output (MIMO) systems, computer programs, and so forth, as will be described below in more detail. Thus, the parameters may comprise functional parameters of any of a wide variety of systems, e.g., the above-mentioned filter coefficients, topologies for networks, generalized coordinates, e.g., with respect to complex systems such as proteins (e.g., for estimating protean folding), and so forth. Moreover, in various embodiments, the parameters may include representational parameters of the models as well, such as fixed point field sizes for the functional parameters, among others, as described herein.

An embedding of the family of systems into an abstract geometrical space with a metric may be determined. The abstract geometrical space may be continuous, and may be defined by the parameters of the family of system. Note that as used herein, the term "continuous" means that the space itself may be abstractly considered to be continuous, but may be represented as substantially continuous, e.g., within some value epsilon, due to limitations inherent to or imposed upon the computer resources used to represent the space. At least some coordinates of the abstract geometrical space may specify values for the parameters of systems of the family of systems. Thus, the abstract geometrical space may form or include a possibly high dimensional "configuration space" for the family of systems, where each point in the space specifies or represents a particular instance of a system. The abstract geometrical space may further accommodate or include a grid of discrete points representing respective discrete approximations of systems of the family of systems. Note that as used herein, the term "grid" refers to a specified ordered locus of points, and is specifically not limited to linear, e.g., rectilinear grids, but may have any of a variety of forms, e.g., based on the application. The space and grid may be considered to be (typically non-Euclidean) configuration "landscapes" that may be searched for substantially optimal solutions.

In various embodiments, the abstract geometrical space may be or include a Euclidean space, a non-Euclidean space, a Riemannian manifold, or a Finsler geometry, among other abstract geometric spaces. Note that specific applications may benefit from or even require the particular space used, and that any spaces may be used as desired or needed. For example, in some embodiments, the family of systems may be a family of filters of a specified order, where the abstract geometrical space is or includes a continuous space of the filters of the specified order, such as, e.g., finite impulse response (FIR) filters, or infinite impulse response (IIR) filters, among others. In other exemplary embodiments, the abstract geometrical space may include a space of proportional/integral/derivative (PID) controllers, a space of single input/single output (SISO) systems, or a space of multi-input/multi-output (MIMO) systems, among others.

A first point in the abstract geometrical space corresponding to a desired instance of a system may be determined or specified, where the coordinates of the first point specify values for the parameters of the desired instance of the system. In other words, a point may be selected that specifies some desired design of the system, where the coordinates of the point specify values for parameters of the system. Thus, in the filter example, the point may specify values for the filter coefficients, and/or, field sizes for fixed point representations of functional parameters for the filters.

The abstract geometrical space may be sampled using a mapping of a well-distributed set of points from a Euclidean space of the parameters to the abstract geometrical space, where the mapping fairly maps the Euclidean space to the abstract geometrical space.

A nearest discrete point to the first point in the abstract geometrical space may be determined in accordance with the metric based on the sampling described above. The nearest discrete point may specify values for parameters for a substantially optimal discrete approximation of the desired instance of the system. Note that as used herein, "substantially optimal" means "within some specified tolerance or epsilon", e.g., as specified by a user or inherent to the design or system used to perform the method, such as grid resolution, computer resources, and so forth. Thus, in various embodiments, "substantially optimal" may denote that the value (or system) is within 10%, 5%, 2%, 1%, 0.5%, or 0.1% of the theoretical optimal value(s), among others. Note that this "tolerance" may be due to any of design, economic, or computational resource constraints, among others, dependent upon the host (e.g., development platform upon which the present method is performed) and/or target platform (e.g., platform upon which the discrete approximation is implemented).

The specified values for the discrete approximation may be stored, e.g., in a memory medium, where the specified values are useable to implement the discrete approximation of the desired instance of the system. For example, the values may be used to implement a substantially optimal discrete version of a reference system, e.g., an ideal infinite precision system, such as a filter, as described in more detail below. In some embodiments, the specified value may then be used to implement the desired instance of the system. For example, a filter may be designed and manufactured based on the determined coefficients, although it should be noted that the techniques disclosed herein are broadly applicable in a wide variety of fields and domains.

BRIEF DESCRIPTION OF THE DRAWINGS

A better understanding of the present invention can be obtained when the following detailed description of the preferred embodiment is considered in conjunction with the following drawings, in which:

FIG. 3A is a high level block diagram of an exemplary system which may execute or utilize graphical programs;

FIG. 3B illustrates an exemplary system which may perform control and/or simulation functions utilizing graphical programs;

Figure 1A:
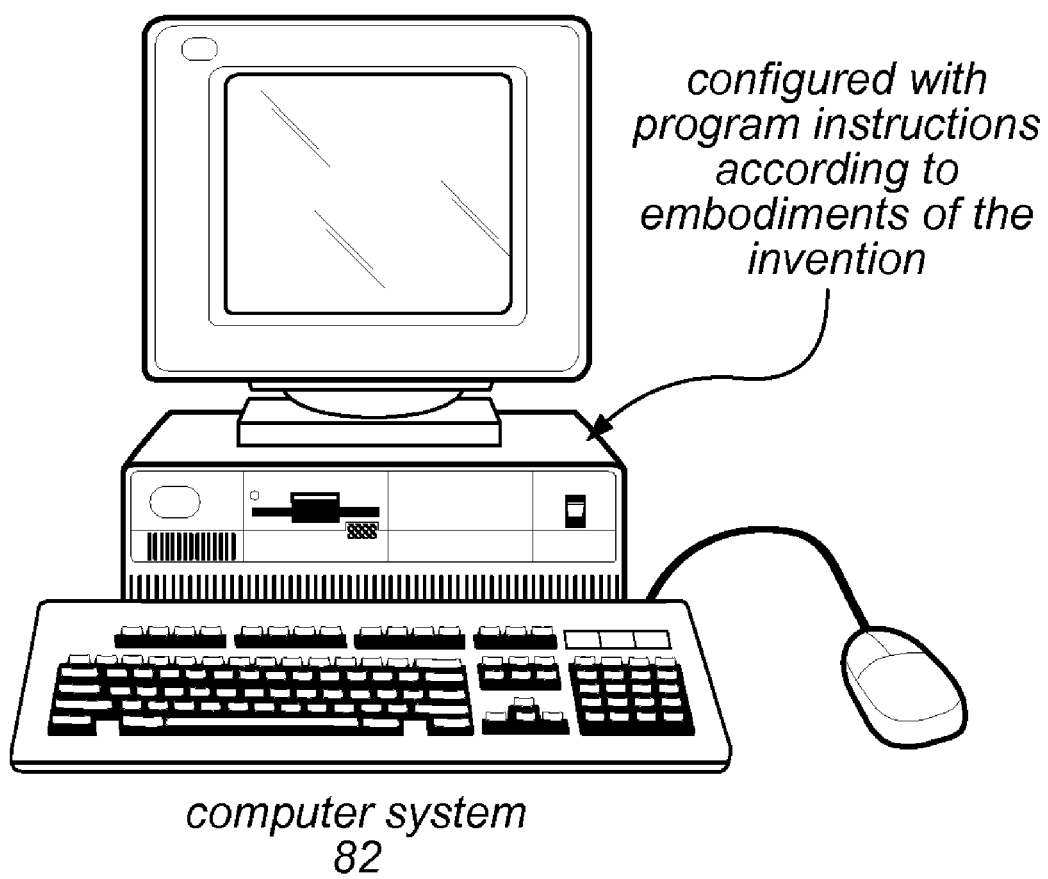
FIG. 1A illustrates a computer system operable to execute a graphical program according to an embodiment of the present invention.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Incorporation by Reference

The following references are hereby incorporated by reference in their entirety as though fully and completely set forth herein:

U.S. Pat. No. 4,914,568 titled "Graphical System for Modeling a Process and Associated Method," issued on Apr. 3, 1990.

U.S. Pat. No. 5,481,741 titled "Method and Apparatus for Providing Attribute Nodes in a Graphical Data Flow Environment".

U.S. Pat. No. 6,173,438 titled "Embedded Graphical Programming System" filed Aug. 18, 1997.

U.S. Pat. No. 6,219,628 titled "System and Method for Configuring an Instrument to Perform Measurement Functions Utilizing Conversion of Graphical Programs into Hardware Implementations," filed Aug. 18, 1997.

U.S. Patent Application Publication No. 20010020291 (Ser. No. 09/745,023) titled "System and Method for Programmatically Generating a Graphical Program in Response to Program Information," filed Dec. 20, 2000.

S. Ramamoorthy, L. Wenzel, J. Nagle, J., and M. Cerna, "A Differential Geometric Approach To Discrete-Coefficient Filter Design", IEEE Asilomar Conference on Signals, Systems, and Computers, Oct. 26-29, 2008.

Terms

The following is a glossary of terms used in the present application:

Memory Medium—Any of various types of memory devices or storage devices. The term "memory medium" is intended to include an installation medium, e.g., a CD-ROM, floppy disks, or tape device; a computer system memory or random access memory such as DRAM, DDR RAM, SRAM, EDO RAM, Rambus RAM, etc.; or a non-volatile memory such as a magnetic media, e.g., a hard drive, or optical storage. The memory medium may comprise other types of memory as well, or combinations thereof. In addition, the memory medium may be located in a first computer in which the programs are executed, and/or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as a physical transmission medium, such as a bus, network, and/or other physical transmission medium that conveys signals such as electrical, electromagnetic, or digital signals.

Programmable Hardware Element—includes various hardware devices comprising multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Program—the term "program" is intended to have the full breadth of its ordinary meaning The term "program" includes 1) a software program which may be stored in a memory and is executable by a processor or 2) a hardware configuration program useable for configuring a programmable hardware element.

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, PASCAL, FORTRAN, COBOL, JAVA, assembly language, etc.; graphical programs (programs written in graphical programming languages); assembly language programs; programs that have been compiled to machine language; scripts; and other types of executable software. A software program may comprise two or more software programs that interoperate in some manner. Note that various embodiments described herein may be implemented by a computer or software program. A software program may be stored as program instructions on a memory medium.

Hardware Configuration Program—a program, e.g., a netlist or bit file, that can be used to program or configure a programmable hardware element.

Graphical Program—A program comprising a plurality of interconnected nodes or icons, wherein the plurality of interconnected nodes or icons visually indicate functionality of the program. Graphical function nodes may also be referred to as blocks.

The following provides examples of various aspects of graphical programs. The following examples and discussion are not intended to limit the above definition of graphical program, but rather provide examples of what the term "graphical program" encompasses:

The nodes in a graphical program may be connected in one or more of a data flow, control flow, and/or execution flow format. The nodes may also be connected in a "signal flow" format, which is a subset of data flow.

Exemplary graphical program development environments which may be used to create graphical programs include LabVIEW®, DasyLab™, DiaDem™ and Matrixx/SystemBuild™ from National Instruments, Simulink® from the MathWorks, VEE™ from Agilent, WiT™ from Coreco, Vision Program Manager™ from PPT Vision, SoftWIRE™ from Measurement Computing, Sanscript™ from Northwoods Software, Khoros™ from Khoral Research, SnapMaster™ from HEM Data, VisSim™ from Visual Solutions, ObjectBench™ by SES (Scientific and Engineering Software), and VisiDAQ™ from Advantech, among others.

The term "graphical program" includes models or block diagrams created in graphical modeling environments, wherein the model or block diagram comprises interconnected blocks (i.e., nodes) or icons that visually indicate operation of the model or block diagram; exemplary graphical modeling environments include Simulink®, SystemBuild™, VisSim™, Hypersignal Block Diagram™, etc.

A graphical program may be represented in the memory of the computer system as data structures and/or program instructions. The graphical program, e.g., these data structures and/or program instructions, may be compiled or interpreted to produce machine language that accomplishes the desired method or process as shown in the graphical program.

Input data to a graphical program may be received from any of various sources, such as from a device, unit under test, a process being measured or controlled, another computer program, a database, or from a file. Also, a user may input data to a graphical program or virtual instrument using a graphical user interface, e.g., a front panel.

A graphical program may optionally have a GUI associated with the graphical program. In this case, the plurality of interconnected blocks or nodes are often referred to as the block diagram portion of the graphical program.

Node—In the context of a graphical program, an element that may be included in a graphical program. The graphical program nodes (or simply nodes) in a graphical program may also be referred to as blocks. A node may have an associated icon that represents the node in the graphical program, as well as underlying code and/or data that implements functionality of the node. Exemplary nodes (or blocks) include function nodes, sub-program nodes, terminal nodes, structure nodes, etc. Nodes may be connected together in a graphical program by connection icons or wires.

Data Flow Program—A Software Program in which the program architecture is that of a directed graph specifying the flow of data through the program, and thus functions execute whenever the necessary input data are available. Data flow programs can be contrasted with procedural programs, which specify an execution flow of computations to be performed.

Graphical Data Flow Program (or Graphical Data Flow Diagram)—A graphical program or diagram comprising a plurality of interconnected nodes (blocks), wherein at least a subset of the connections among the nodes visually indicate that data produced by one node is used by another node. A LabVIEW VI is one example of a graphical data flow program. A Simulink block diagram is another example of a graphical data flow program.

Graphical User Interface—this term is intended to have the full breadth of its ordinary meaning The term "Graphical User Interface" is often abbreviated to "GUI". A GUI may comprise only one or more input GUI elements, only one or more output GUI elements, or both input and output GUI elements.

The following provides examples of various aspects of GUIs. The following examples and discussion are not intended to limit the ordinary meaning of GUI, but rather provide examples of what the term "graphical user interface" encompasses:

A GUI may comprise a single window having one or more GUI Elements, or may comprise a plurality of individual GUI Elements (or individual windows each having one or more GUI Elements), wherein the individual GUI Elements or windows may optionally be tiled together.

A GUI may be associated with a graphical program. In this instance, various mechanisms may be used to connect GUI Elements in the GUI with nodes in the graphical program. For example, when Input Controls and Output Indicators are created in the GUI, corresponding nodes (e.g., terminals) may be automatically created in the graphical program or block diagram. Alternatively, the user can place terminal nodes in the block diagram which may cause the display of corresponding GUI Elements front panel objects in the GUI, either at edit time or later at run time. As another example, the GUI may comprise GUI Elements embedded in the block diagram portion of the graphical program.

Front Panel—A Graphical User Interface that includes input controls and output indicators, and which enables a user to interactively control or manipulate the input being provided to a program, and view output of the program, while the program is executing.

A front panel is a type of GUI. A front panel may be associated with a graphical program as described above.

In an instrumentation application, the front panel can be analogized to the front panel of an instrument. In an industrial automation application the front panel can be analogized to the MMI (Man Machine Interface) of a device. The user may adjust the controls on the front panel to affect the input and view the output on the respective indicators.

Graphical User Interface Element—an element of a graphical user interface, such as for providing input or displaying output. Exemplary graphical user interface elements comprise input controls and output indicators.

Input Control—a graphical user interface element for providing user input to a program. An input control displays the value input the by the user and is capable of being manipulated at the discretion of the user. Exemplary input controls comprise dials, knobs, sliders, input text boxes, etc.

Output Indicator—a graphical user interface element for displaying output from a program. Exemplary output indicators include charts, graphs, gauges, output text boxes, numeric displays, etc. An output indicator is sometimes referred to as an "output control".

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device—includes instruments, data acquisition devices, smart sensors, and any of various types of devices that are operable to acquire and/or store data. A measurement device may also optionally be further operable to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further operable to perform control functions, e.g., in response to analysis of the acquired or stored data. For example, the measurement device may send a control signal to an external system, such as a motion control system or to a sensor, in response to particular data. A measurement device may also be operable to perform automation functions, i.e., may receive and analyze data, and issue automation control signals in response.

Subset—in a set having N elements, the term "subset" comprises any combination of one or more of the elements, up to and including the full set of N elements. For example, a subset of a plurality of icons may be any one icon of the plurality of the icons, any combination of one or more of the icons, or all of the icons in the plurality of icons. Thus, a subset of an entity may refer to any single element of the entity as well as any portion up to and including the entirety of the entity.

FIG. 1A—Computer System

FIG. 1A illustrates a computer system 82 configured with program instructions, e.g., a program, for approximating a system, according to one embodiment. Embodiments of a method for approximating a system are described below.

As shown in FIG. 1A, the computer system 82 may include a display device operable to display the program as the program is created and/or executed. The display device may also be operable to display a graphical user interface of the program during execution of the program. The graphical user interface may comprise any type of graphical user interface, e.g., depending on the computing platform. In various embodiments, the program may include one or more additional programs or subprograms. The program and/or any of its other programs or subprograms, may be text-based or graphical in nature. Examples of text-based programming languages include C, C++, JAVA, PASCAL, and FORTRAN, among others. An exemplary graphical programming system is the LabVIEW graphical programming system provided by National Instruments Corporation. As noted above, a graphical program comprises a plurality of interconnected nodes or icons, where the plurality of interconnected nodes or icons visually indicate functionality of the program. The interconnected nodes or icons may be referred to as a block diagram, and may be interconnected in one or more of a data flow, control flow, or execution flow format. A graphical user interface (GUI) for the graphical program may be referred to as a front panel.

The computer system 82 may include at least one memory medium on which one or more computer programs or software components according to one embodiment of the present invention may be stored. For example, the memory medium may store one or more graphical (and/or text-based) programs which are executable to perform the methods described herein. In other words, in some embodiments, the systems and methods described herein may be implemented in software, and executable by one or more computer systems, such as computer system 82. Additionally, the memory medium may store a graphical programming development environment application used to create and/or execute such graphical programs. The memory medium may also store operating system software, as well as other software for operation of the computer system. Various embodiments further include receiving or storing instructions and/or data implemented in accordance with the foregoing description upon a carrier medium.

Figure 1B:
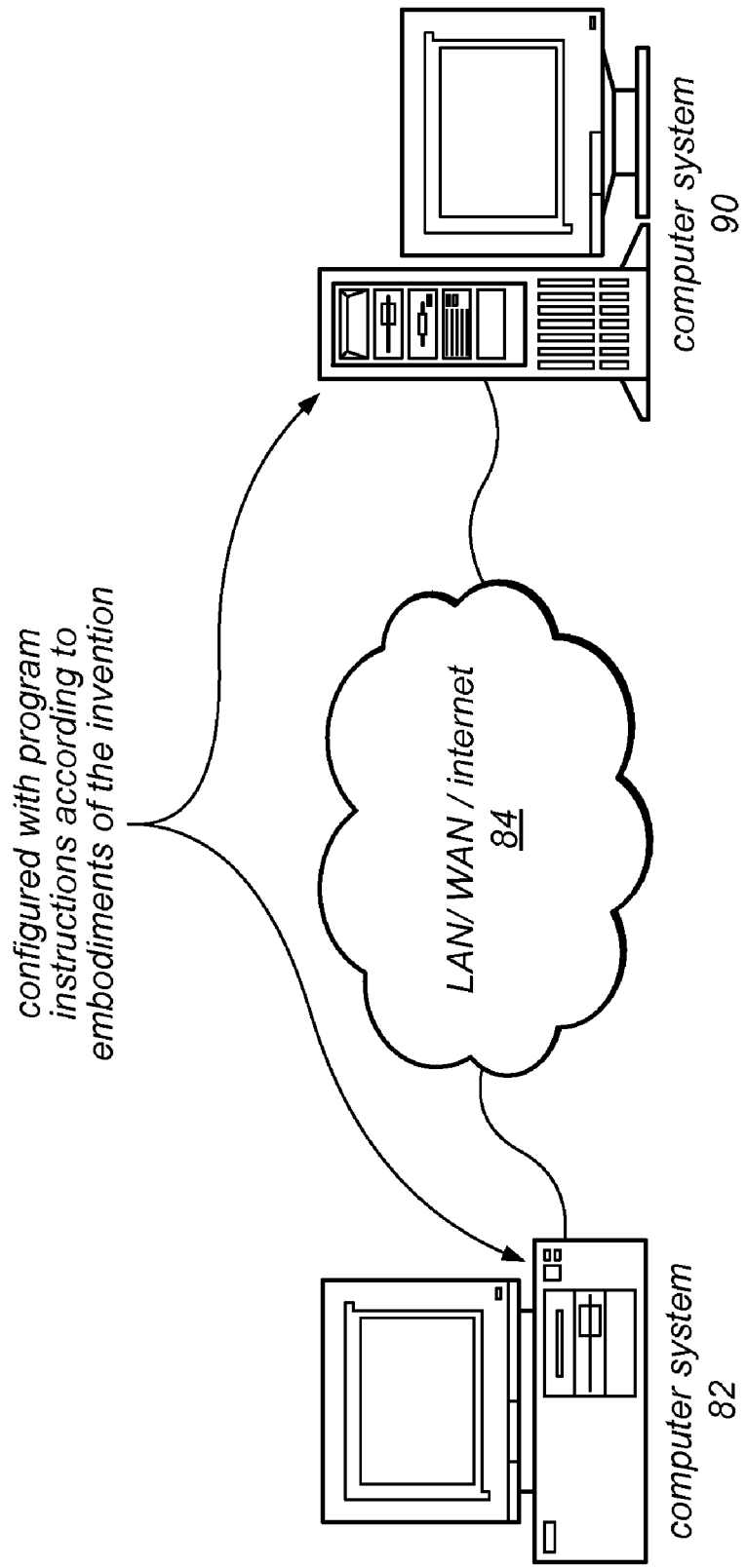
FIG. 1B illustrates a network system comprising two or more computer systems that may implement an embodiment of the present invention.

FIG. 1B—Computer Network

FIG. 1B illustrates a system including a first computer system 82 that is coupled to a second computer system 90. The computer system 82 may be coupled via a network 84 (or a computer bus) to the second computer system 90. The computer systems 82 and 90 may each be any of various types, as desired. The network 84 can also be any of various types, including a LAN (local area network), WAN (wide area network), the Internet, or an Intranet, among others. The computer systems 82 and 90 may execute a program, such as a graphical program, in a distributed fashion. For example, in some graphical program embodiments, computer 82 may execute a first portion of the block diagram of a graphical program and computer system 90 may execute a second portion of the block diagram of the graphical program. As another example, computer 82 may display the graphical user interface of a graphical program and computer system 90 may execute the block diagram of the graphical program.

In one embodiment, the graphical user interface of the graphical program may be displayed on a display device of the computer system 82, and the block diagram may execute on a device coupled to the computer system 82. The device may include a programmable hardware element and/or may include a processor and memory medium which may execute a real time operating system. In one embodiment, the graphical program may be downloaded and executed on the device. For example, an application development environment with which the graphical program is associated may provide support for downloading a graphical program for execution on the device in a real time system.

Exemplary Systems

Embodiments of the present invention may be involved with performing test and/or measurement functions; controlling and/or modeling instrumentation or industrial automation hardware; modeling and simulation functions, e.g., modeling or simulating a device or product being developed or tested, etc. Exemplary test applications where the graphical program may be used include hardware-in-the-loop testing and rapid control prototyping, among others.

However, it is noted that the present invention can be used for a plethora of applications and is not limited to the above applications. In other words, applications discussed in the present description are exemplary only, and the present invention may be used in any of various types of systems. Thus, the system and method of the present invention is operable to be used in any of various types of applications, including the control of other types of devices such as multimedia devices, video devices, audio devices, telephony devices, Internet devices, etc., as well as general purpose software applications such as word processing, spreadsheets, network control, network monitoring, financial applications, games, etc.

Figure 2A:
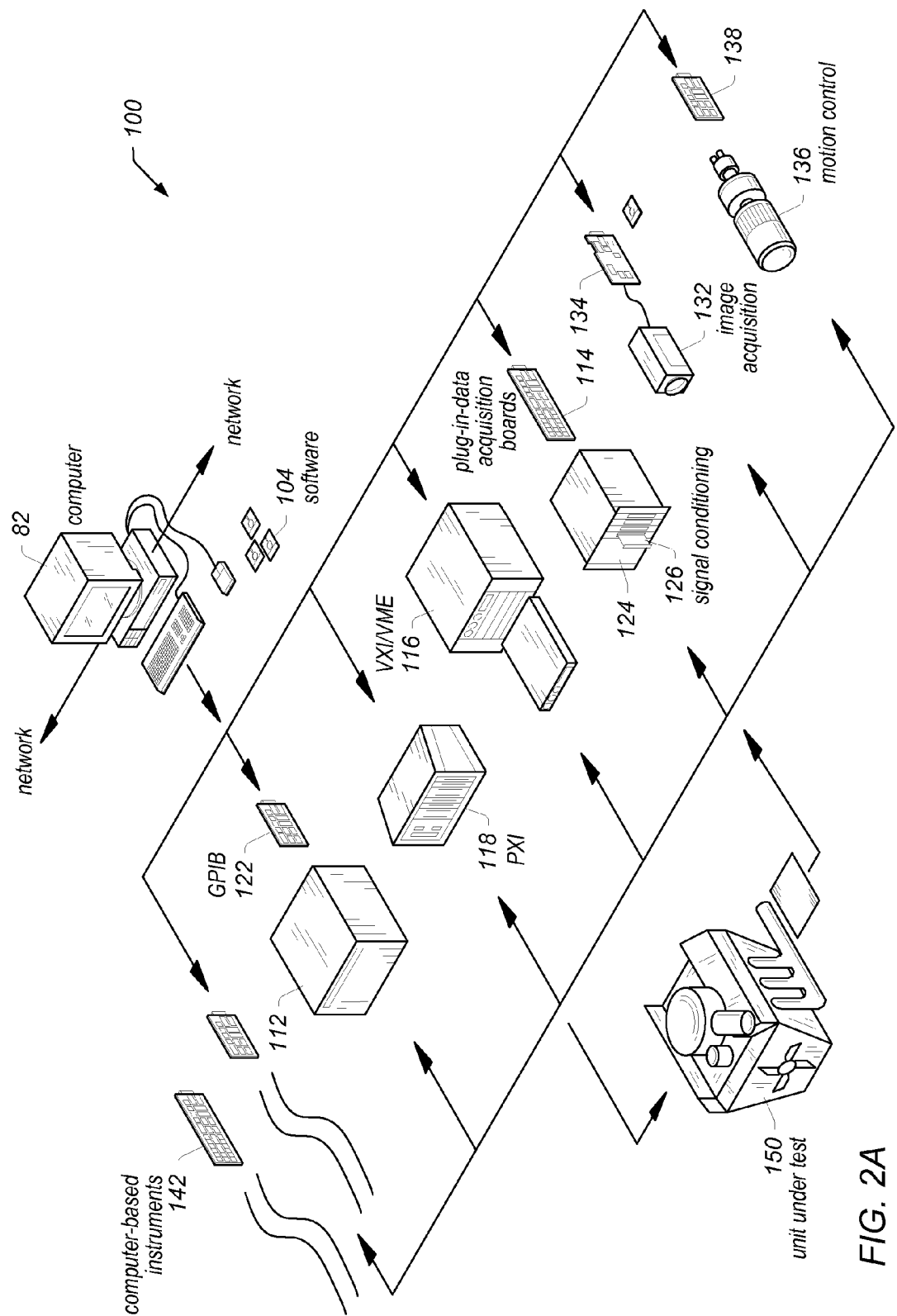
FIG. 2A illustrates an instrumentation control system according to one embodiment of the invention.

FIG. 2A illustrates an exemplary instrumentation control system 100 which may implement embodiments of the invention. The system 100 comprises a host computer 82 which couples to one or more instruments. The host computer 82 may comprise a CPU, a display screen, memory, and one or more input devices such as a mouse or keyboard as shown. The computer 82 may operate with the one or more instruments to analyze, measure or control a unit under test (UUT) or process 150.

The one or more instruments may include a GPIB instrument 112 and associated GPIB interface card 122, a data acquisition board 114 inserted into or otherwise coupled with chassis 124 with associated signal conditioning circuitry 126, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices. The computer system may couple to and operate with one or more of these instruments. The instruments may be coupled to the unit under test (UUT) or process 150, or may be coupled to receive field signals, typically generated by transducers. The system 100 may be used in a data acquisition and control application, in a test and measurement application, an image processing or machine vision application, a process control application, an industrial automation application, a man-machine interface application, a simulation application, or a hardware-in-the-loop validation application, among others.

Figure 2B:
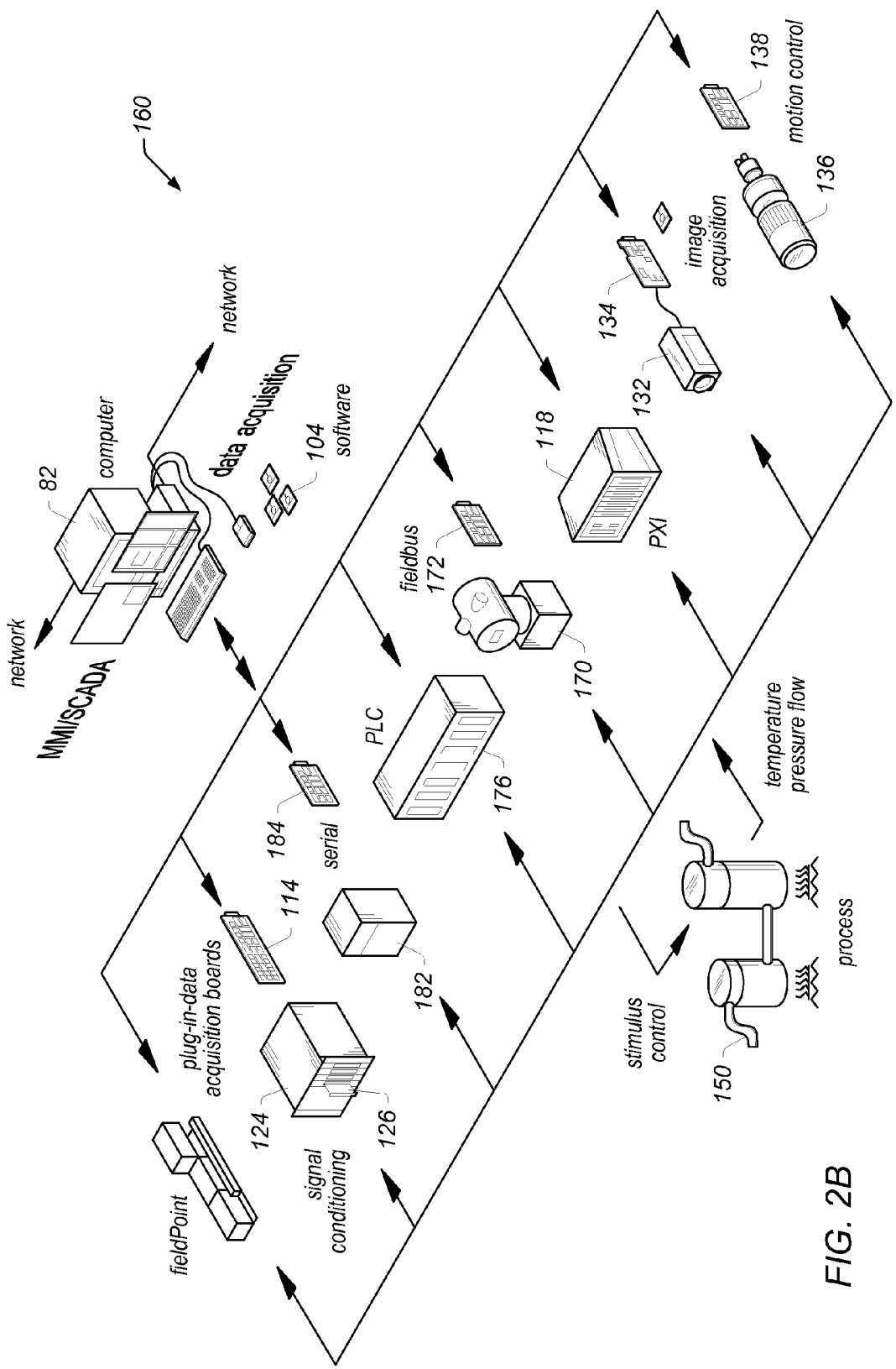
FIG. 2B illustrates an industrial automation system according to one embodiment of the invention.

FIG. 2B illustrates an exemplary industrial automation system 160 which may implement embodiments of the invention. The industrial automation system 160 is similar to the instrumentation or test and measurement system 100 shown in FIG. 2A. Elements which are similar or identical to elements in FIG. 2A have the same reference numerals for convenience. The system 160 may comprise a computer 82 which couples to one or more devices or instruments. The computer 82 may comprise a CPU, a display screen, memory, and one or more input devices such as a mouse or keyboard as shown. The computer 82 may operate with the one or more devices to perform an automation function with respect to a process or device 150, such as MMI (Man Machine Interface), SCADA (Supervisory Control and Data Acquisition), portable or distributed data acquisition, process control, advanced analysis, or other control, among others.

The one or more devices may include a data acquisition board 114 inserted into or otherwise coupled with chassis 124 with associated signal conditioning circuitry 126, a PXI instrument 118, a video device 132 and associated image acquisition card 134, a motion control device 136 and associated motion control interface card 138, a fieldbus device 170 and associated fieldbus interface card 172, a PLC (Programmable Logic Controller) 176, a serial instrument 182 and associated serial interface card 184, or a distributed data acquisition system, such as the Fieldpoint system available from National Instruments, among other types of devices.

FIG. 3A is a high level block diagram of an exemplary system which may execute or utilize programs according to some embodiments of the present invention. FIG. 3A illustrates a general high-level block diagram of a generic control and/or simulation system which comprises a controller 92 and a plant 94. The controller 92 represents a control system/algorithm the user may be trying to develop. The plant 94 represents the system the user may be trying to control. For example, if the user is designing an ECU for a car, the controller 92 is the ECU and the plant 94 is the car's engine (and possibly other components such as transmission, brakes, and so on.) As shown, a user may create a program that specifies or implements the functionality of one or both of the controller 92 and the plant 94. For example, a control engineer may use a modeling and simulation tool to create a model (program) of the plant 94 and/or to create the algorithm (program) for the controller 92.

FIG. 3B illustrates an exemplary system which may perform control and/or simulation functions. As shown, the controller 92 may be implemented by a computer system 82 or other device (e.g., including a processor and memory medium and/or including a programmable hardware element) that executes or implements a program, e.g., a graphical program. In a similar manner, the plant 94 may be implemented by a computer system or other device 144 (e.g., including a processor and memory medium and/or including a programmable hardware element) that executes or implements a program, or may be implemented in or as a real physical system, e.g., a car engine.

In one embodiment of the invention, one or more graphical programs may be created which are used in performing rapid control prototyping. Rapid Control Prototyping (RCP) generally refers to the process by which a user develops a control algorithm and quickly executes that algorithm on a target controller connected to a real system. The user may develop the control algorithm using a program, and the program may execute on the controller 92, e.g., on a computer system or other device. The computer system 82 may be a platform that supports real time execution, e.g., a device including a processor that executes a real time operating system (RTOS), or a device including a programmable hardware element.

In one embodiment of the invention, one or more programs may be created which are used in performing Hardware in the Loop (HIL) simulation. Hardware in the Loop (HIL) refers to the execution of the plant model 94 in real time to test operation of a real controller 92. For example, once the controller 92 has been designed, it may be expensive and complicated to actually test the controller 92 thoroughly in a real plant, e.g., a real car. Thus, the plant model (implemented by a program, e.g., a graphical program) is executed in real time to make the real controller 92 "believe" or operate as if it is connected to a real plant, e.g., a real engine.

In the embodiments of FIGS. 2A, 2B, and 3B above, one or more of the various devices may couple to each other over a network, such as the Internet. In one embodiment, the user operates to select a target device from a plurality of possible target devices for programming or configuration using a program. Thus the user may create a program, e.g., a graphical program, on a computer and use (execute) the program on that computer or deploy the program to a target device (for remote execution on the target device) that is remotely located from the computer and coupled to the computer through a network.

Graphical software programs which perform data acquisition, analysis and/or presentation, e.g., for measurement, instrumentation control, industrial automation, modeling, or simulation, such as in the applications shown in FIGS. 2A and 2B, may be referred to as virtual instruments.

Figure 4:
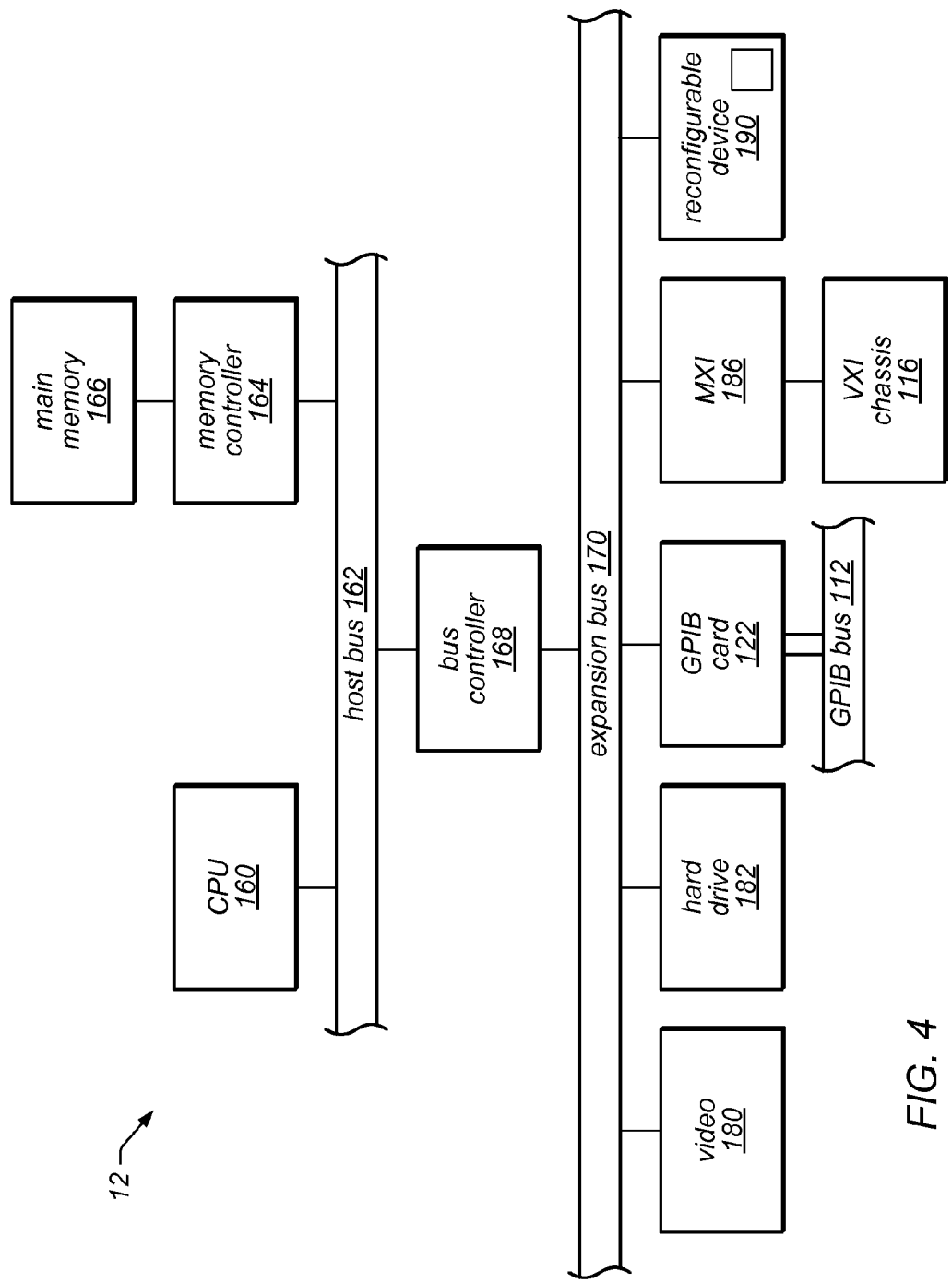
FIG. 4 is an exemplary block diagram of the computer systems of FIGS. 1A, 1B, 2A and 2B and 3B.

FIG. 4—Computer System Block Diagram

FIG. 4 is a block diagram representing one embodiment of the computer system 82 and/or 90 illustrated in FIGS. 1A and 1B, or computer system 82 shown in FIG. 2A or 2B. It is noted that any type of computer system configuration or architecture can be used as desired, and FIG. 4 illustrates a representative PC embodiment. It is also noted that the computer system may be a general purpose computer system, a computer implemented on a card installed in a chassis, or other types of embodiments. Elements of a computer not necessary to understand the present description have been omitted for simplicity.

The computer may include at least one central processing unit or CPU (processor) 160 which is coupled to a processor or host bus 162. The CPU 160 may be any of various types, including an x86 processor, e.g., a Pentium class, a PowerPC processor, a CPU from the SPARC family of RISC processors, as well as others. A memory medium, typically comprising RAM and referred to as main memory, 166 is coupled to the host bus 162 by means of memory controller 164. The main memory 166 may store the program, e.g., graphical program, operable to approximate a system. The main memory may also store operating system software, as well as other software for operation of the computer system.

The host bus 162 may be coupled to an expansion or input/output bus 170 by means of a bus controller 168 or bus bridge logic. The expansion bus 170 may be the PCI (Peripheral Component Interconnect) expansion bus, although other bus types can be used. The expansion bus 170 includes slots for various devices such as described above. The computer 82 further comprises a video display subsystem 180 and hard drive 182 coupled to the expansion bus 170. The computer 82 may also comprise a GPIB card 122 coupled to a GPIB bus 112, and/or an MXI device 186 coupled to a VXI chassis 116.

As shown, a device 190 may also be connected to the computer. The device 190 may include a processor and memory which may execute a real time operating system. The device 190 may also or instead comprise a programmable hardware element. The computer system may be operable to deploy a program to the device 190 for execution of the program on the device 190. In the case of a graphical program, the deployed program may take the form of graphical program instructions or data structures that directly represents the graphical program. Alternatively, the deployed graphical program may take the form of text code (e.g., C code) generated from the graphical program. As another example, the deployed graphical program may take the form of compiled code generated from either the graphical program or from text code that in turn was generated from the graphical program.

As noted above (see Background), determination of discrete approximations of ideal (e.g., "infinite precision") designs for systems, e.g., to implement real-world systems, may be difficult, counter-intuitive, computationally infeasible, or even intractable, due to nonlinear or complex interdependencies among parameters of such systems. Below are described embodiments of a method for dealing with such problems that more directly utilizes the geometry of the space of systems, hence reducing the complexity of the problem when compared to standard combinatorial optimization and heuristic search algorithms. More specifically, a geometric formulation of the distance between systems is described in terms of system dynamics, which facilitates an efficient search, e.g., a shape search, for the nearest discrete neighbor of a given infinite-precision system (e.g., model or design). A more formal treatment of the concepts involved, as well as descriptions of exemplary applications, is also provided below.

Figure 5:
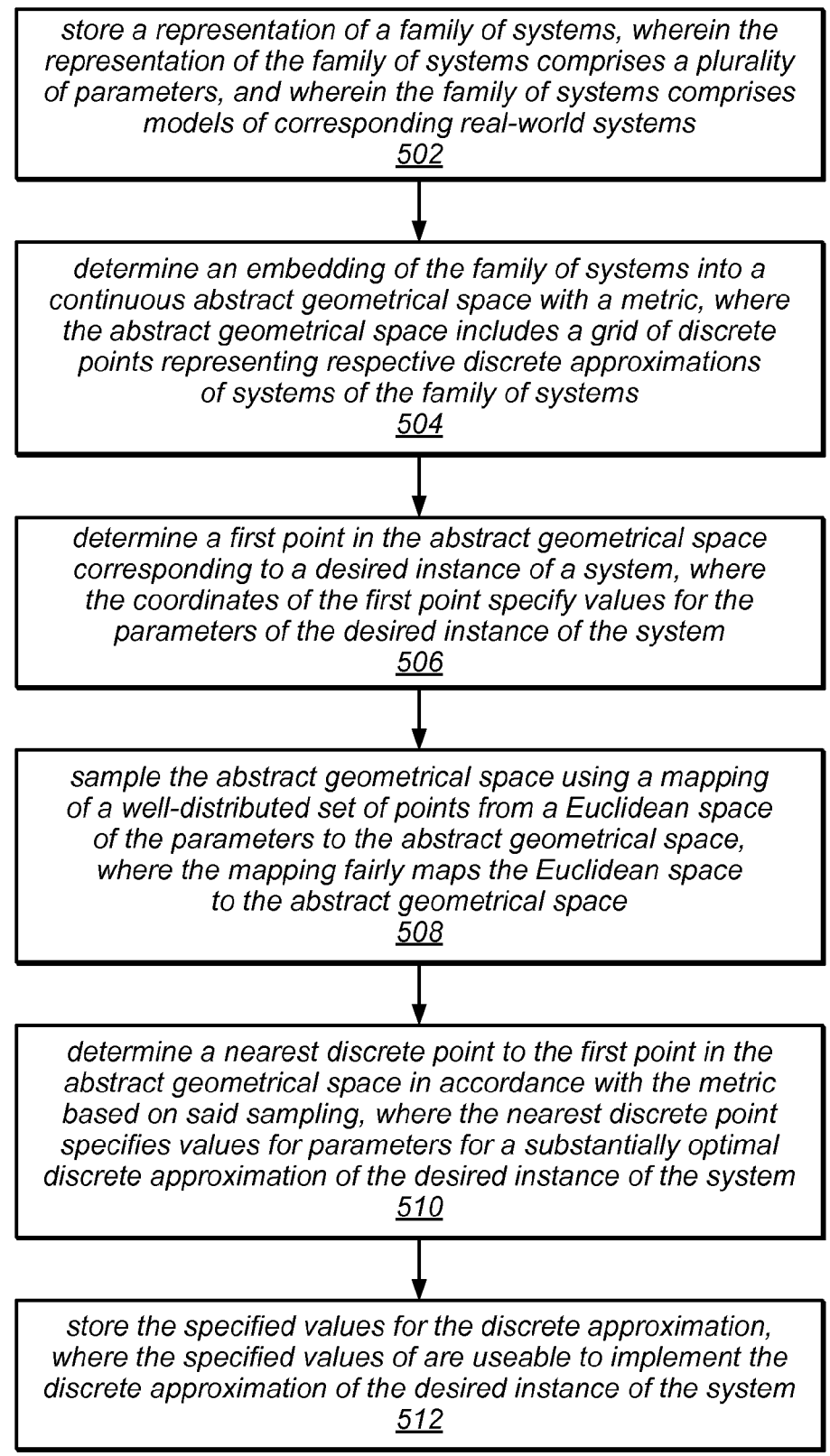
FIG. 5 is a flowchart diagram illustrating one embodiment of a method for discrete approximation of a system using an abstract geometrical space.

FIG. 5—Flowchart of a Method for Approximating a System Using an Abstract Geometrical Space FIG. 5 illustrates a method for discrete approximation of a system using an abstract geometrical space. The method shown in FIG. 5 may be used in conjunction with any of the computer systems or devices shown in the above Figures, among other devices. In various embodiments, some of the method elements shown may be performed concurrently, in a different order than shown, or may be omitted. Additional method elements may also be performed as desired. As shown, this method may operate as follows.

First, in 502, a representation of a family of systems may be stored in a computer memory. The representation of the family of systems may include a plurality of parameters, and the family of systems may be or include models of corresponding real-world systems.

For example, as will be described in more detail below, in some embodiments, the systems may be filters and the parameters may be or include coefficients for various filter designs, e.g., finite impulse response (FIR) or infinite impulse response (IIR) filters. In these embodiments, the representation may be or include analytic expressions, such as rational polynomials representing the gain/frequency response of the filters.

Note, however, that other embodiments may be directed to a wide range of other systems, e.g., proportional/integral/derivative (PID) controllers, single input/single output (SISO) systems, multi-input/multi-output (MIMO) systems, computer programs, and so forth, as will be described below in more detail. Thus, the parameters may comprise functional parameters of any of a wide variety of systems, e.g., the above-mentioned filter coefficients, topologies for networks, generalized coordinates, e.g., with respect to complex systems such as proteins (e.g., for estimating protean folding), and so forth. Moreover, in various embodiments, the parameters may include representational parameters of the models as well, such as fixed point field sizes for the functional parameters, among others, as also described below.

In 504, an embedding of the family of systems into an abstract geometrical space with a metric may be determined. The abstract geometrical space may be continuous, and may be defined by the parameters of the family of system. Note that as used herein, the term "continuous" means that the space itself may be abstractly considered to be continuous, but may be represented as substantially continuous, e.g., within some value epsilon, due to limitations inherent to or imposed upon the computer resources used to represent the space. At least some coordinates of the abstract geometrical space may specify values for the parameters of systems of the family of systems. Thus, the abstract geometrical space may form or include a possibly high dimensional "configuration space" for the family of systems, where each point in the space specifies or represents a particular instance of a system. The abstract geometrical space may further accommodate or include a grid of discrete points representing respective discrete approximations of systems of the family of systems. Note that as used herein, the term "grid" refers to a specified ordered locus of points, and is specifically not limited to linear, e.g., rectilinear grids, but may have any of a variety of forms, e.g., based on the application. The space and grid may be considered to be (typically non-Euclidean) configuration "landscapes" that may be searched for substantially optimal solutions.

In various embodiments, the abstract geometrical space may be or include a Euclidean space, a non-Euclidean space, a Riemannian manifold, or a Finsler geometry, among other abstract geometric spaces. Note that specific applications may benefit from or even require the particular space used, and that any spaces may be used as desired or needed. For example, in some embodiments, the family of systems may be a family of filters of a specified order, where the abstract geometrical space is or includes a continuous space of the filters of the specified order, such as, e.g., finite impulse response (FIR) filters, or infinite impulse response (IIR) filters, among others. In other exemplary embodiments, the abstract geometrical space may include a space of proportional/integral/derivative (PID) controllers, a space of single input/single output (SISO) systems, or a space of multi-input/multi-output (MIMO) systems, among others.

In 506, a first point in the abstract geometrical space corresponding to a desired instance of a system may be determined or specified, where the coordinates of the first point specify values for the parameters of the desired instance of the system. In other words, a point may be selected that specifies some desired design of the system, where the coordinates of the point specify values for parameters of the system. Thus, in the filter example, the point may specify values for the filter coefficients, and/or, field sizes for fixed point representations of functional parameters for the filters.

In 508, the abstract geometrical space may be sampled using a mapping of a well-distributed set of points from a Euclidean space of the parameters to the abstract geometrical space, where the mapping fairly maps the Euclidean space to the abstract geometrical space.

In 510, a nearest discrete point to the first point in the abstract geometrical space may be determined in accordance with the metric based on the sampling of 508. The nearest discrete point may specify values for parameters for a substantially optimal discrete approximation of the desired instance of the system. Note that as used herein, "substantially optimal" means "within some specified tolerance or epsilon", e.g., as specified by a user or inherent to the design or system used to perform the method, such as grid resolution, computer resources, and so forth. Thus, in various embodiments, "substantially optimal" may denote that the value (or system) is within 10%, 5%, 2%, 1%, 0.5%, or 0.1% of the theoretical optimal value(s), among others. Note that this "tolerance" may be due to any of design, economic, or computational resource constraints, among others, dependent upon the host (e.g., development platform upon which the present method is performed) and/or target platform (e.g., platform upon which the discrete approximation is implemented).

In 512, the specified values for the discrete approximation may be stored, e.g., in a memory medium, where the specified values are useable to implement the discrete approximation of the desired instance of the system. For example, the values may be used to implement a substantially optimal discrete version of a reference or ideal infinite precision system, such as a filter, as described in more detail below.

In some embodiments, the specified value may then be used to implement the desired instance of the system. For example, a filter may be designed and manufactured based on the determined coefficients.

Example: Digital Filter Design

A common approach to digital filter design is the use of integer programming to directly minimize an error with respect to desired frequency response. With the availability of increased computing power, this has been expanded to parallel implementations of large-scale mixed-integer linear programs. The optimization problem has also been approached using numerous heuristic search methods including simulated annealing, evolution strategies, ant colony optimization, and other local search methods. In most of these approaches, the cost function is represented in a weighted sum form with terms for frequency response error, concerns such as psychophysical requirements, and a measure of scarcity or complexity (e.g., number of non-zero bits or multipliers).

In contrast, in embodiments of the techniques disclosed herein, the standard error function may be viewed as yielding the 'local' distance on an abstract geometrical space, e.g., a Riemannian manifold of digital filters. Note, however, that in general, even with a proper definition of such a nonlinear manifold, it can be difficult to derive closed form results for geodesics and neighborhoods. Thus, approximation techniques that leverage this structure while keeping computations tractable may be utilized. For example, regarding sampling in abstract spaces, a finite-point set on the manifold may be defined that is fair with respect to the chosen metric. This has the effect of significantly reducing complexity as compared to uninformed search.

Geometry of the Space of Digital Filters

A discrete infinite impulse response (IIR) filter can be defined in the time-domain as:

$$\sum_{j=0}^{M} a_j y[n-j] = \sum_{k=0}^{N} b_k x[n-k], \quad (1)$$

where N, M are the orders of the numerator and denominator, $a_j$, $b_k$ are the reverse and forward coefficients, respectively. By convention, $a_0=1$. After a Z-transform:

$$H(z) = \frac{\sum_{k=0}^{N} b_k z^{-k}}{1 + \sum_{j=1}^{M} a_j z^{-j}}. \quad (2)$$

There are standard ways of designing the coefficients of this system subject to a variety of performance specifications. When dealing with two such systems, say, $H(e^{j\phi})$ and $K(e^{j\phi})$ where the former is the designed system and the latter is a 'desired' system, then one can define an error of the form:

$$\Phi(a_1, \ldots, a_M, b_0, \ldots, b_N) = \int_0^{2\pi} (|H(e^{j\phi})| - |K(e^{j\phi})|)^2 \, d\phi. \quad (3)$$

A typical design goal is to minimize this functional over a suitable field for the coefficients. In particular, the problem with $K(e^{j\Phi})$ representing an infinite-precision designed system and $H(e^{j\Phi})$ involving coefficients $a^j, b^k$ that are restricted to integers, powers-of-two numbers, etc., can be addressed. Consider two filters defined by the coefficients, $c^{(1,2)} = (a_1^{(1,2)}, a_2^{(1,2)}, \ldots, a_M^{(1,2)}, b_0^{(1,2)}, \ldots, b_N^{(1,2)})$, with a distance between them:

$$D(c^{(1)}, c^{(2)}) = \sqrt{\frac{1}{2\pi} \int_0^{2\pi} (|H_{c(1)}(e^{j\phi})| - |H_{c(2)}(e^{j\phi})|)^2 d\phi} \ . \quad (4)$$

In other words, given the space of IIR filters, the metric may be induced by equation (1), the definition of the coefficients, and equation (4). In this embodiment, the first point may specify a reference IIR filter, e.g., an ideal, archetypal, or representative IIR filter, with floating point coefficients (e.g., within the space of IIR filters), and the grid points may specify respective IIR filters within this space with coefficients that have fixed point representations of respective specified precisions. D represents a distance between system configurations $c^1$ and $c^2$ (or, said another way, between the coefficients (sets) $c^1$ and $c^2$), per the specified metric for the space. Note that the expression for D integrates over the unit circle.

With $c^{(2)} = c^{(1)} + dc^{(1)}$, the distance may be rewritten as:

$$ds^2 = D^2(c^{(1)}, c^{(1)} + dc^{(1)}) \quad (5)$$
$$= \sum_{i,j=1}^{N+M+1} g_{ij}(c^{(1)}) d\alpha_i d\alpha_j + O((dc^{(1)})^3),$$

where $\alpha_1 = a_1^{(1)}, \ldots, \alpha_M = a_M^{(1)}, \alpha_{M+1} = b_0^{(1)}, \ldots, \alpha_{M+N+1} = b_N^{(1)}$ and g becomes a metric tensor in the sense of Riemannian geometry. As noted above, the sets of coefficients $c^1$ and $c^2$ may be considered to be respective system configurations specifying instances of the system(s).

In a slightly different embodiment, the space of IIR filters may comprise a Riemannian space of stable IIR filters, where the metric is induced by equation (1), the definition of the coefficients, and a modified version of equation (4), where the integral is performed over the unit disk, rather than the unit circle as with equation (4):

$$D(c^1, c^2) = \sqrt{\int_0^1 \int_0^{2\pi} (|H_{(c^1)}(re^{i\varphi})| - |H_{(c^2)}(re^{i\varphi})|)^2 d\varphi \, dr} \ , \quad (4A)$$

where, again, the first point specifies a reference IIR filter, e.g., an ideal, archetypal, or representative IIR filter, with floating point coefficients, where the grid points specify respective IIR filters with coefficients having fixed point representations of respective specified precisions.

The above equations, although derived from differences in frequency response, capture more information about the nature of the problem. For instance, one could compute the Gauss curvature, K, of the manifold represented by this metric and infer facts such as that zero curvature corresponds to a simple re-parametrization for which standard parameter optimization suffices whereas a manifold with non-zero curvature calls for more sophisticated treatment.

Note that this is one among many ways to define a metric in the space of digital filters or linear systems. Often, alternatives have been focused on analysis rather than synthesis, e.g., to understand the Lie group structure of the space of linear systems or to understand properties of power spectral density functions. Indeed, the procedure described in the following sections may be adapted to work with these alternate metrics as well.

Fair Sampling on Nonlinear Manifolds

The design problem is essentially that of finding a nearest neighbor to the desired system response. The practical difficulty is that this neighborhood relation is not very well behaved in the coefficient space and naïve approaches such as rounding yield very poor approximations. Instead, use may be made of the fact that the proper definition of neighborhood is provided by a metric such as in equation 5. Having established the geometric structure, there is still the issue of how to compute on this manifold. Analytically computing paths and regions on general manifolds is a difficult problem, infeasible except in special cases. However, this computation may be approached indirectly, by first sampling the space to create a finite point set that is fair (in a precisely defined sense) with respect to the metric. An exact procedure is described below.

Consider a nonlinear manifold that is defined in terms of parameters $u_2, \ldots, u_n$ and the metric tensor g. If one considers this manifold to be generated by some mapping from the Euclidean plane, then fair mappings may be defined to be those that preserve area or volume in the sense of:

$$\psi(u_1, \ldots, u_n) = \sqrt{det(g_{ij}(u_1, \ldots, u_n))} = c \quad (6)$$

Once such a mapping is obtained (for some c), an efficient procedure for incrementally sampling the Euclidean plane may then—through this mapping—allow efficient sampling on the manifold. The following theorem provides conditions that such a mapping should satisfy.

Theorem 3.1

Let $\Psi(u_1, u_2, \ldots, u_n)$ be a nonnegative function on $[0, 1]_n$ where $\Psi^2$ is continuously differentiable. Let $\Psi(u_1, u_2, \ldots, u_n)$ be positive with exception of a set L of points $(u_1, u_2, \ldots, u_n)$ of Lebesgue-measure 0. For $(u_1, u_2, \ldots, u_n) \notin L$, let $$f_1(u_1, u_2, \ldots, u_n) = \frac{\int_0^{u_1} \Psi(u_1, \ldots, u_n) du_1}{\int_0^1 \Psi(u_1, \ldots, u_n) du_1} \quad (7)$$

$$\ldots$$

$$f_{n-1}(u_{n-1}, u_n) = \frac{\int_0^{u_{n-1}} \int_0^1 \ldots \int_0^1 \Psi(u_1, \ldots, u_n) du_1 \ldots du_n}{\int_0^1 \int_0^1 \ldots \int_0^1 \Psi(u_1, \ldots, u_n) du_1 \ldots du_n}$$

$$f_n(u_n) = \frac{\int_0^{u_n} \int_0^1 \ldots \int_0^1 \Psi(u_1, \ldots, u_n) du_1 \ldots du_n}{\int_0^1 \int_0^1 \ldots \int_0^1 \Psi(u_1, \ldots, u_n) du_1 \ldots du_n}.$$

Furthermore, let the functions $f_1, f_2, \ldots, f_n$ be extendable to continuously differentiable mappings defined on $[0, 1]^n$. Then the extension functions $(f_1, f_2, \ldots, f_n)$ define a diffeomorphism of $[0, 1]^n/L$ where equation 6 is valid for a constant c.

Based on this, the following algorithm for sampling a manifold may be defined:

1. Given an abstract surface S defined on $[0, 1]^n$, where $\Psi(u_1, \ldots, u_n)$ satisfies propositions of Theorem 3.1 and where $x(u_1, \ldots, u_n)$ is an embedding of S in $\mathcal{H}^n$, construct $f(u_1, \ldots, u_n) = (f_1(u_1, \ldots, u_n), \ldots, f_n(u_1, \ldots, u_n))$ defined over $[0, 1]^n$.

2. Compute the inverse, $f^{-1}(u_1, \ldots, u_n)$.

3. Beginning with a well-distributed set $D \notin \mathfrak{R}^n$, (e.g., incrementally generated by a quasi-Monte Carlo method), compute the image of D under the transform $x(f^{-1}(u_1, \ldots, u_n))$.

The output of the above procedure is a point set that samples the nonlinear manifold fairly.

Finding the Nearest Discrete-Coefficient Neighbor of a Filter

In one embodiment, the design may proceed in a two stages. The first stage involves local optimization to determine a candidate discrete coefficient filter (a point in a multi-dimensional lattice). This computation is local in the sense that it focuses the search to a unimodal neighborhood on the error surface of the floating-point design. The outcome of this step is an initial guess that is much better than naïve coefficient rounding but, of course, not the global optimum. Beginning with this initial point and using knowledge of the metric tensor (equation 5), which provides principal directions along which to focus further search, the region to be sampled (section 3) may be defined to determine the optimal filter design.

Note that the computation of the start point may ignore the global Riemannian structure and solve a local Euclidean optimization problem. For example, consider a filter defined by the coefficient vector $c_0 \in \mathfrak{R}^{M+N+1}$ and a corresponding discrete-coefficient filter, defined by coefficients $\hat{c} \in Z^{M+N+1}$. In a local sense, the filter defined by coefficients $\hat{c}^*$ is a good approximation to the filter defined by coefficients $c_0$ at a critical point of a quantity of the form $(\hat{c}-c_0)^t Q (\hat{c}-c_0)$, where Q is locally identical (shares eigenvalues) to the metric tensor g. After algebraic manipulation, this can be posed in the form, $$\hat{c}^* = \arg\min \hat{c}^t Q \hat{c} + b^t \hat{c} \quad (8)$$

Note that there are many efficient algorithms for solving this problem. In high dimensions, the point $\hat{c}^*$ represents a significantly better starting point for further sampling than, e.g., rounding. Next, the extent of the region within which to sample may be determined. Here, a famous result by Minkowski may be used. The following question may be asked: given our knowledge of the curvature of the space, which manifests itself as the aspect ratio and principal direction of an ellipsoid centered on the current point, how big should the ellipsoid be so as to guarantee inclusion of at least one non-trivial grid point (representing a discrete coefficient design)? The following result provides such an estimate.

Theorem 4.1 (Minkowski)

Let S be a subset in $\mathfrak{R}^n$ that is symmetric with respect to the origin. If the volume V of S is greater than $2^n$, then S must contain at least 3 grid points from a uniform axis aligned lattice—the origin and two non-trivial points ±P.

Consider the case of an n-dimensional ellipsoid S with principal axes of length $r_1, \ldots, r_d$. The corresponding volume is:

$$V = \frac{\pi^{\frac{d}{2}}}{\Gamma\left(\frac{d}{2}+1\right)} r_1 \ldots r_d. \quad (9)$$

If this ellipsoid were scaled by a positive factor s, guaranteeing the existence of a grid point within it, then:

$$s \geq \frac{2}{\sqrt{\pi}} \frac{\sqrt[d]{\Gamma\left(\frac{d}{2}+1\right)}}{\sqrt[d]{r_1 \ldots r_d}} \quad (10)$$

Knowing that:

$$\frac{2}{\sqrt{\pi}} \sqrt[d]{\Gamma\left(\frac{d}{2}+1\right)} < \sqrt{d}, \quad (11)$$

the scaling factor reduces to:

$$s > \frac{\sqrt{d}}{\sqrt[d]{r_1 \ldots r_d}}. \quad (12)$$

The following provides a concise exemplary description in pseudo-code of a method for computing a discrete-coefficient digital filter based on the above, according to one embodiment.

Algorithm 1: Computation of Discrete-Coefficient Digital Filter

INPUT: Floating point filter defined by coefficients $C_0$; discretization level for desired filter; Error Tolerance.

OUTPUT: Discrete coefficient filter defined by $\hat{C}$.

Compute metric tensor g, per equation 5.

Construct a semi-definite matrix Q that agrees with g at $C_0$.

Solve for initial guess $\hat{C}_0$ by a minimization per equation 8.

Compute scale factor for an ellipse centered at $\hat{C}_0$, per equation 12.

while Error>Tolerance do

Generate samples within ellipse, per fair sampling technique described above-note that these samples are not necessarily grid points;

Compute closest grid point using equation 8;

end while

Figure 6:
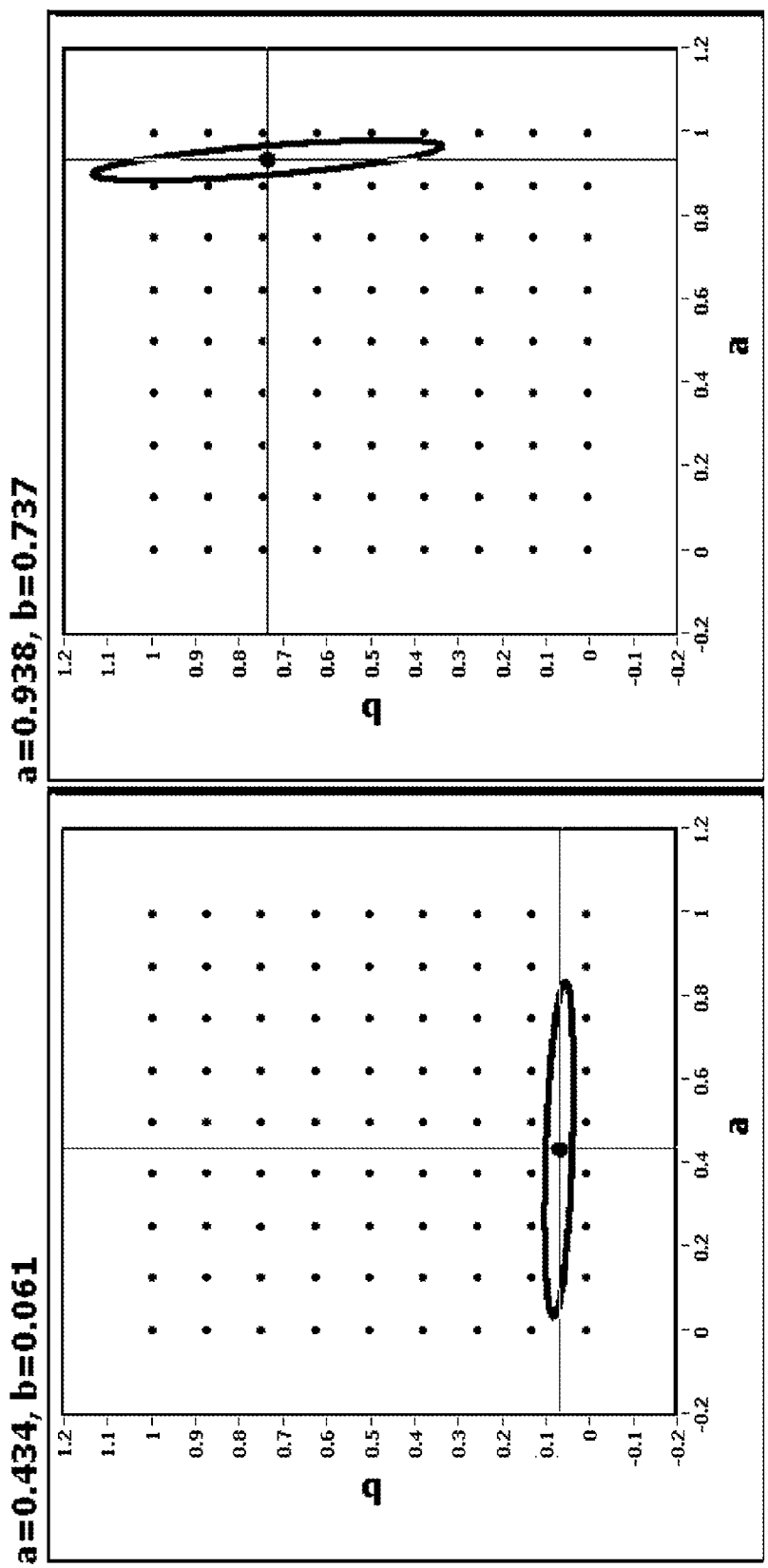
FIG. 6 illustrates exemplary neighborhoods of specified points based on the metric tensor for the defined abstract geometrical space, according to one embodiment.

FIG. 6—Local Neighborhoods Based on Metric Tensor

FIG. 6 illustrates exemplary neighborhoods of specified points based on the metric tensor for the defined abstract geometrical space. Note that due to the non-Euclidean nature of the space, what might naïvely be expected to be circular neighborhoods are highly elongated ellipses, thus dramatically affecting which grid points may be considered nearest to the specified points.

Figure 7:
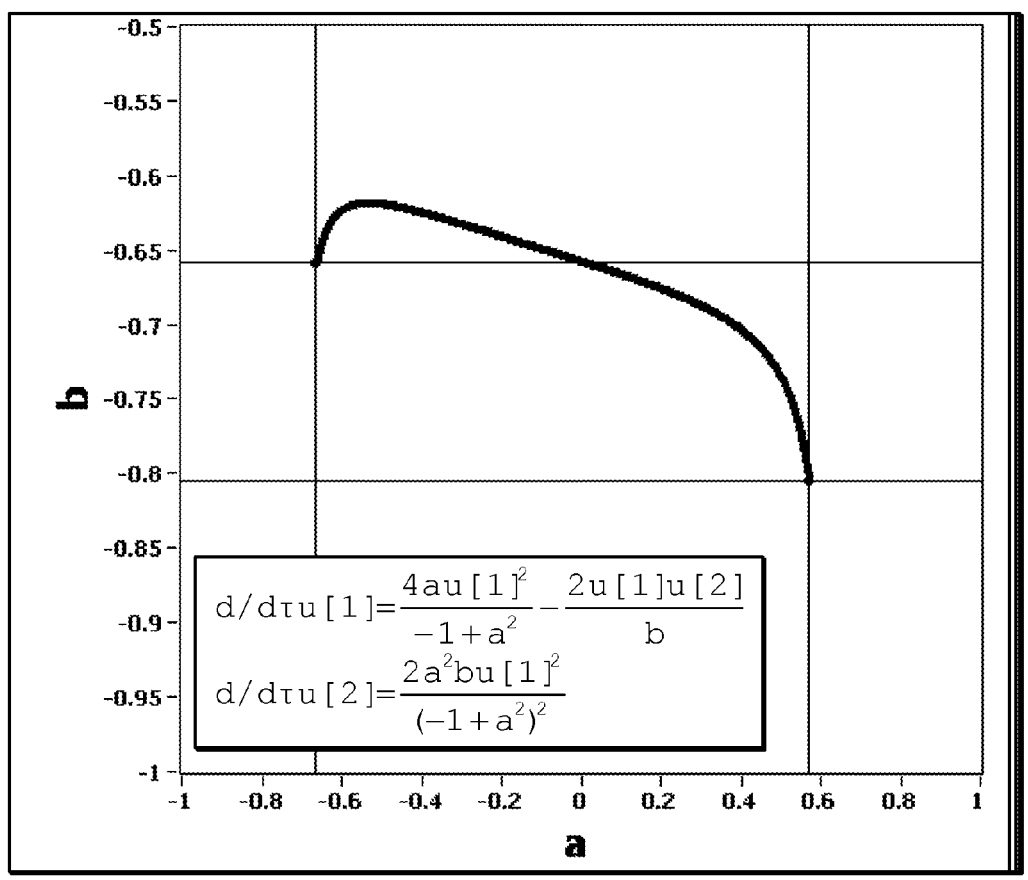
FIG. 7 illustrates an analytically computed geodesic in the space of first-order IIR filters, according to one embodiment.

FIG. 7—Geodesic Based on Metric Tensor

FIG. 7 illustrates an exemplary analytically computed geodesic in the space of first-order IIR filters. Note that this curve is significantly different from a straight line in parameter space—due to the non-Euclidean nature of the abstract geometrical space.

EXPERIMENTS AND EXAMPLES

An exemplary use of the above algorithm is now described with respect to concrete examples. First, a first-order IIR filter is considered, for which the metric is determined, and the geometric issues discussed thus far are illustrated. Then, results for more complex systems are presented, demonstrating tangible benefits in terms of design objectives.

Consider the filter, $$H(z) = \frac{b}{1 + az^{-1}}. \quad (13)$$

$$ds^2 = \frac{1}{2\pi} \int_0^{2\pi} \left| \frac{b + db}{1 + (a + da)e^{-j\phi}} - \frac{b}{1 + ae^{-j\phi}} \right|^2 d\phi \quad (14)$$

$$ds^2 = \frac{(1+a^2)b^2}{(1-a^2)^3} da^2 + 2\frac{ab}{(1-a^2)^2} da\, db + \quad (15)$$
$$\frac{1}{1-a^2} db^2 + O(da^3, da^2, db, da^2, db^2 db^3).$$

The resulting behavior is summarized in FIGS. 6 and 7, described above.

Figure 8:
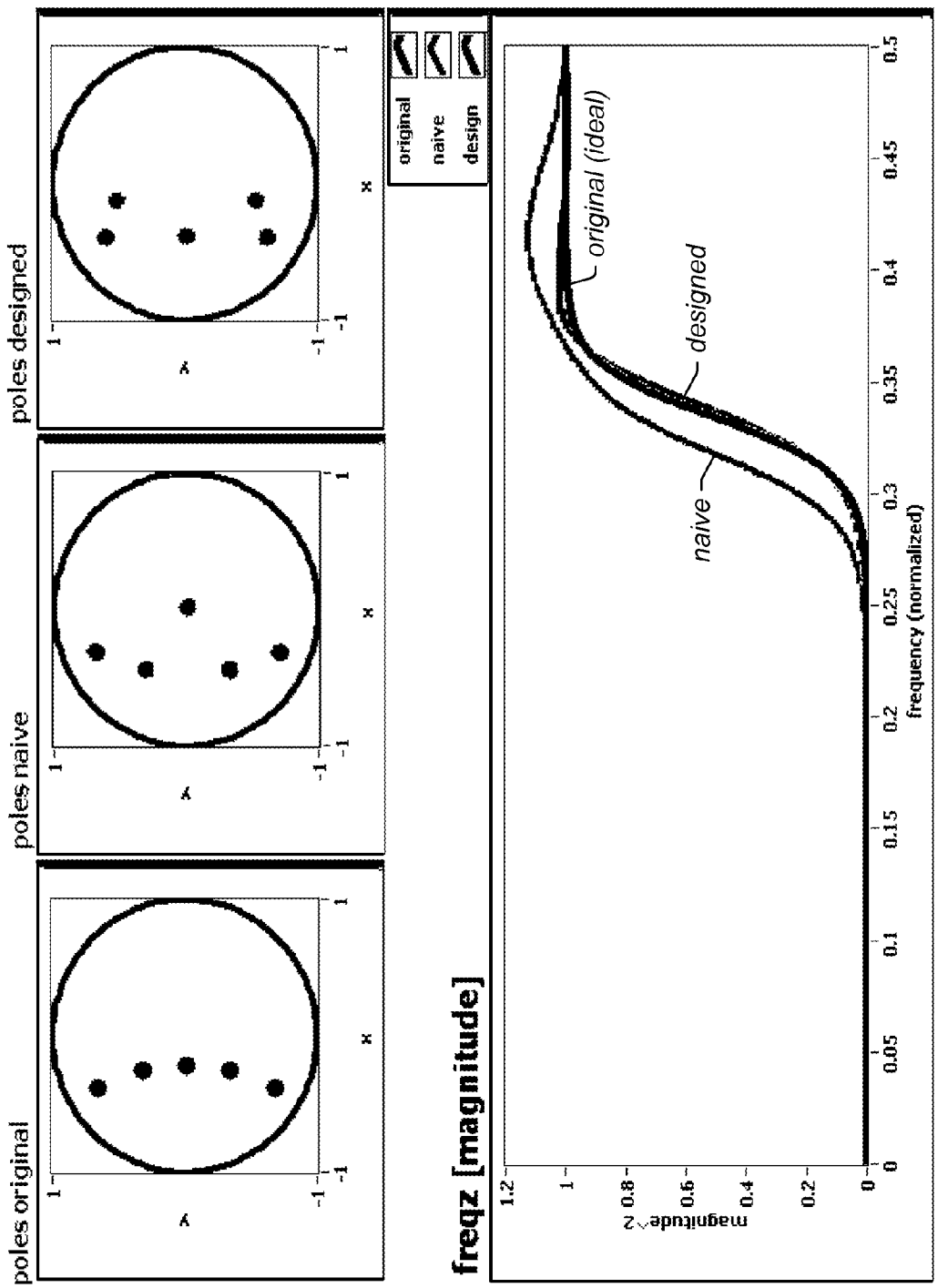
FIG. 8 illustrates ideal and discrete approximations of a high-pass inverse Chebyshev filter, according to one embodiment.
Figure 9:
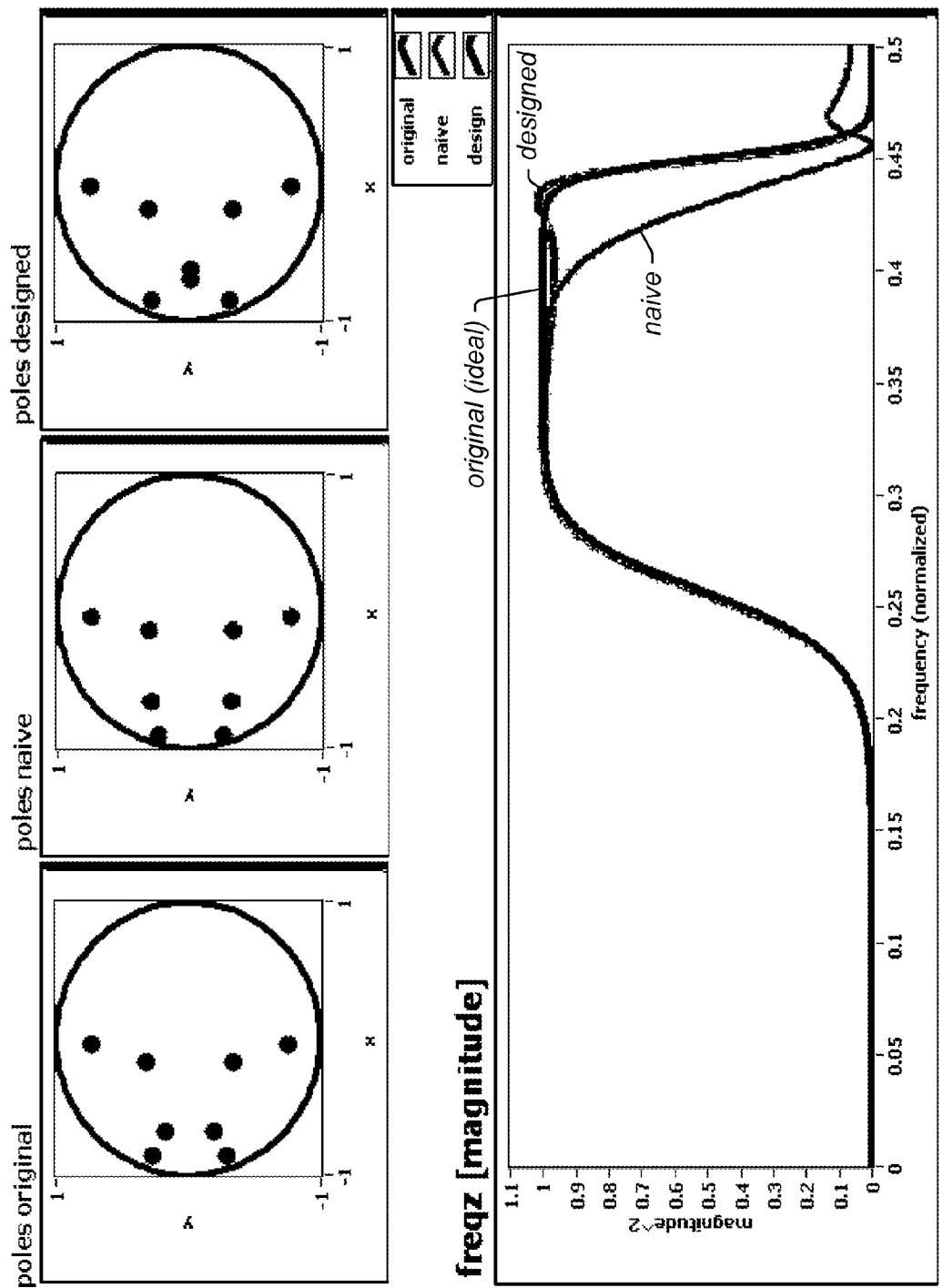
FIG. 9 illustrates ideal and discrete approximations of a band-pass Butterworth filter, according to one embodiment.

Further design examples are presented in FIGS. 8 and 9, where the performance of Algorithm 1 is compared against uninformed random sampling in the neighborhood of the floating-point design—subject to the constraint of discrete coefficients. This comparison is made by computing a factor q which measures the number of samples required by uninformed random sampling over that required by the procedure of Algorithm 1. To the extent that many heuristic search and global optimization algorithms utilize such random sampling as an essential component, this measure illustrates the benefits of incorporating geometric information into the process, as described herein.

FIG. 8 is directed to a high-pass inverse Chebyshev filter of order 5 (4-bit implementation). The top three plots (reading from left to right) illustrate the poles of the original (e.g., ideal) design, the naïve approach, and per an embodiment of the present technique, respectively. The bottom plot shows the corresponding respective frequency response of the three designs or configurations. As may be seen, use of the techniques described herein produces much better results than a naïve random sampling algorithm, specifically, by a factor $q=1:1390\times10^7$, and the quality of approximation is clearly superior.

FIG. 9 is directed to a band-pass Butterworth filter of order 4 (8-bit implementation). As may be seen, poles and frequency response are shown for original (e.g., ideal), naïve, and designed (per the techniques disclosed herein) configurations. Similar to the Chebyshev filter example, the design generated per the techniques disclosed herein is significantly better than a naïve random sampling algorithm, in this case, by a factor $q=7:9428\times10^{11}$, and the quality of approximation is similarly superior.

Thus, the two exemplary filter design examples shown in FIGS. 8 and 9 show that embodiments of the techniques described herein produce results that are orders of magnitude better than those using the naïve sampling approaches of the prior art.

A simple, counterintuitive, example that underscores the benefits of the geometric approach is now presented. Consider an FIR filter of the form:

$$H(z) = (1 - az^{-1})(1 - bz^{-1}). \quad (16)$$

The corresponding Riemannian metric can be derived as:

$$ds^2 = (1+b^2)da^2 + 2(1+ab)da\,db + (1+a^2)db^2. \quad (17)$$

A specific floating-point design is (a=0.5, b=200.5). A naïve approach might suggest the discrete equivalent (a=1, b=200). In fact, in the sense of the metric tensor above, a much better design is (a=1, b=150), significantly further away from the original design than one might have intuitively expected. Thus, embodiments of the techniques disclosed herein may produce non-intuitive solutions that are dramatically superior to previous methods.

Thus, the above presents methods for computing discrete-coefficient approximations of an infinite-precision filter, using the non-Euclidean geometry arising from differences in frequency response. This structure allows the practitioner to significantly focus searches so that the computational complexity of the native combinatorial optimization problem can be tamed. The method, as presented, is but one application to which the disclosed techniques may be applied. Further systematic procedures to improve estimates such as in equation 12, and other sophisticated versions of local optimization, in combination with the geometric sampling procedure disclosed herein, provide further improvements in the efficiency of design—enabling more complex systems and specifications.

Further Applications

The above described applications of the disclosed techniques, while very useful, are exemplary; embodiments of these techniques are broadly applicable in many other domains, and in unexpected ways. As discussed above, exemplary functional parameters of systems may include values for filter coefficients, topologies for networks, generalized coordinates, e.g., with respect to complex systems such as proteins (e.g., for estimating protean folding), among others, and may also include representational parameters of the models, such as fixed point field sizes for such functional parameters, among others. More generally, in some embodiments, the abstract geometrical space may be a space of functions with a finite set of continuous parameters. In other words, each point in the space may represent a function with a finite set of continuous parameters, and so may be represent an extremely broad range of phenomena and systems, including complex abstract systems, e.g., corresponding to subtle behaviors and complexities of real-world systems.

It should be noted that in some embodiments, the space may include points that specify systems, e.g., ideal systems, that may not be (currently) physically realizable, but for which implementable discrete approximations may be determined. For example, as mentioned above, in some embodiments, the abstract geometrical space may comprise a continuous space of fixed point field sizes, e.g., for various other system parameters. In other words, the abstract geometrical space may include continuous coordinates specifying numbers with a fractional number of bits, where the grid is composed of discrete points in the abstract geometrical corresponding to numbers represented by an integer number of bits.

Note that regarding such cases where the abstract geometrical space is or includes a continuous space of fixed point field sizes, the notion of a 2.7 bit data field is a peculiar one, and perhaps not readily implementable, but may be a feature of an ideal system whose discrete approximation may provide an optimal or near-optimal implementable design. In other words, determination of a feasible substantially optimal solution corresponding to a grid point (with integer-sized fixed point fields) may rely on specification of an ideal or "unreal" system (the "first point" mentioned above).

In one embodiment of such a system, distance in the continuous space of fixed point field sizes may be augmented by resource constraints regarding the fixed point field sizes. This may be important, for example, in the design and deployment of circuit designs or programs onto programmable hardware elements, such as field programmable gate arrays (FPGAs), where physical resources are limited. For example, due to size and/or element type constraints, it may be the case that only so much "real estate" is available for storing parameters, and so one may be forced to prioritize allocation of available storage bits, i.e., field sizes, among the parameters, which is a complex and difficult optimization problem which lends itself to the techniques disclosed herein. In various embodiments, such constraints may be implemented as soft or hard constraints, and may be separate from, or included in, an objective function for the search/optimization process. Note that the above constraints are meant to be exemplary only, and that other constraints may be used as desired, e.g., limitations on current, heat generation, field strength, wire lengths, and so forth, among others.

Thus, various embodiments of the above techniques may be used to determine substantially optimal parameters, e.g., coefficients, given fixed word length (i.e., data field sizes), to determine substantially optimal word length or fixed point field sizes for parameters, or both, among other applications.

As discussed above, in some embodiments, a desired (e.g., ideal) design or instance of a system may be in terms of continuous parameters, whereas the discrete approximations represented by the grid of points in the space, may have discrete parameters. Determining the closest discrete approximation may include determining a difference functional based on a metric of the abstract geometric space, e.g., a nonlinear Riemannian manifold, defined by the substantially continuous parameters, where the difference functional represents an error of the discrete approximation with respect to the continuous system. Thus, the optimization described above may be performed with respect to this distance, which may depend on the metric for the space.

One exemplary application of this technique is regarding programs, such as graphical programs, sometimes referred to as VIs (virtual instruments), especially when referring to graphical programs developed under the LabVIEW graphical program development system, provided by National Instruments Corporation.

More specifically, in some embodiments, the family of systems may include a family of computer programs in a specified programming language, where the parameters include a plurality of continuous parameters, e.g., functional and/or representational parameters. Thus, the abstract geometrical space may be or include a space of programs that encompasses or spans the family of computer programs.

For example, the programs may be graphical programs, such as LabVIEW programs (in the "G" graphical programming language). The family of systems may include a first program and a plurality of automatically generated programs related to the first program. The first point may correspond to the first program, and the distances between points representing the plurality of automatically generated programs and the first point are defined by deviations of respective output of the plurality of automatically generated programs with respect to output of the first program.

In one embodiment, at least a subset of the plurality of programs may be automatically generated based on the sampling of the abstract geometrical space. The first program and the automatically generated programs may be executed to generate respective outputs, and respective distance values for the automatically generated programs may be determined with respect to the first program based on the generated outputs. In other words, the outputs, e.g., the behavior, of the programs may be used to determine the distance between them in the abstract space of programs.

As indicated above, in various embodiments, the programs may include graphical data flow programs operable to perform one or more of: an industrial automation function, a process control function, or a test and measurement function, among others.

In some embodiments, the family of systems may be or include a family of graphs, where the parameters comprise a plurality of continuous parameters. For example, in one embodiment, the graphs may be or include intermediate representations of corresponding programs. The graphs may be any type of graph as desired, e.g., directed acyclic graphs (DAGs), such as may be used as intermediate representations of data flow programs, e.g., LabVIEW graphical data flow programs, among others.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A non-transitory computer-accessible memory medium that stores program instructions for approximating a system, wherein the program instructions are executable by a processor to:
store a representation of a family of systems in a computer memory, wherein the family of systems comprises models of corresponding real-world systems, wherein the family of systems comprises a family of filters of a specified order, wherein the representation of the family of systems comprises a plurality of parameters, and wherein the parameters comprise one or more of:
functional parameters of the models; or
representational parameters of the models;
determine an embedding of the family of systems into an abstract geometrical space with a metric, wherein the abstract geometrical space is continuous, wherein the abstract geometrical space is defined by the parameters, wherein at least some coordinates of the abstract geometrical space specify values for the parameters of systems of the family of systems, wherein the abstract geometrical space comprises a continuous space of the filters of the specified order, and wherein the abstract geometrical space comprises a grid of discrete points representing respective discrete approximations of systems of the family of systems;
determine a first point in the abstract geometrical space corresponding to a desired instance of a system, wherein the coordinates of the first point specify values for the parameters of the desired instance of the system;
sample the abstract geometrical space using a mapping of a well-distributed set of points from a Euclidean space of the parameters to the abstract geometrical space, wherein the mapping fairly-maps the Euclidean space to the abstract geometrical space;
determine a nearest discrete point to the first point in the abstract geometrical space in accordance with the metric based on said sampling, wherein the nearest discrete point specifies values for parameters for an a substantially optimal discrete approximation of the desired instance of the system within a specified tolerance; and
store the specified values for the discrete approximation, wherein the specified values of the parameters are useable to implement the discrete approximation of the desired instance of the system.

2. The memory medium of claim 1, wherein the abstract geometrical space comprises a Euclidean space.

3. The memory medium of claim 1, wherein the abstract geometrical space comprises a non-Euclidean space.

4. The memory medium of claim 1, wherein the abstract geometrical space comprises a Riemannian manifold.

5. The memory medium of claim 1, wherein the abstract geometrical space comprises a Finsler geometry.

6. The memory medium of claim 1, wherein the filters comprise:
   finite impulse response (FIR) filters; or
   infinite impulse response (IIR) filters.

7. The memory medium of claim 6, wherein the space of IIR filters comprises a Riemannian space, wherein the metric is induced by:

$$H(z) = \frac{\sum_{k=0}^{N} b_k z^{-k}}{1 + \sum_{j=1}^{M} a_j z^{-j}}$$

$$c^1 = (a_1^1, \ldots, a_M^1; b_0^1, \ldots, b_N^1),$$

$$c^2 = (a_1^2, \ldots, a_M^2; b_0^2, \ldots, b_N^2), \text{ and}$$

$$D(c^1, c^2) = \sqrt{\int_0^{2\pi} (|H_{(c^1)}(e^{i\phi})| - |H_{(c^2)}(e^{i\phi})|)^2 d\varphi}$$

wherein H is a design system, $z = e^{i\Phi}$, $\phi$ is an angle of a unit circle, N and M are orders of the numerator and denominator, and $a_j$, $b_k$ are reverse and forward coefficients, respectively, wherein the first point specifies a reference IIR filter with floating point coefficients, and wherein the grid points specify respective IIR filters with coefficients, wherein the coefficients have fixed point representations of respective specified precisions, wherein D represents a distance between system configurations $c^1$ and $c^2$, wherein a superscript of 1 denotes the first point specifying a first system configuration, and wherein a superscript of 2 denotes a second point specifying a second system configuration.

8. The memory medium of claim 6, wherein the space of IIR filters comprises a Riemannian space of stable IIR filters, wherein the metric is induced by:

$$H(z) = \frac{\sum_{k=0}^{N} b_k z^{-k}}{1 + \sum_{j=1}^{M} a_j z^{-j}}$$

$$c^1 = (a_1^1, \ldots, a_M^1; b_0^1, \ldots, b_N^1),$$

$$c^2 = (a_1^2, \ldots, a_M^2; b_0^2, \ldots, b_N^2), \text{ and}$$

$$D(c^1, c^2) = \sqrt{\int_0^1 \int_0^{2\pi} (|H_{(c^1)}(re^{i\phi})| - |H_{(c^2)}(re^{i\phi})|)^2 d\varphi dr},$$

wherein H is a design system, $z = e^{i\Phi}$, $\phi$ is an angle of a unit disk, r is a radius of the unit disk, N and M are orders of the numerator and denominator, and $a_j$, $b_k$ are reverse and forward coefficients, respectively, wherein the first point specifies a reference IIR filter with floating point coefficients, and wherein the grid points specify respective IIR filters with coefficients having fixed point representations of respective specified precisions, wherein D represents a distance between system configurations $c^1$ and $c^2$ wherein a superscript of 1 denotes the first point specifying a first system configuration, and wherein a superscript of 2 denotes a second point specifying a second system configuration.

9. The memory medium of claim 1, wherein the abstract geometrical space comprises:
   a space of proportional/integral/derivative (PID) controllers;
   a space of single input/single output (SISO) systems; or
   a space of multi-input/multi-output (MIMO) systems.

10. The memory medium of claim 1, wherein the abstract geometrical space comprises a space of functions with a finite set of continuous parameters.

11. The memory medium of claim 1, wherein the abstract geometrical space comprises:
   a continuous space of fixed point field sizes.

12. The memory medium of claim 11, wherein distance in the continuous space of fixed point field sizes is augmented by resource constraints regarding the fixed point field sizes.

13. The memory medium of claim 1, wherein the abstract geometrical space comprises continuous coordinates specifying numbers with a fractional number of bits, and wherein the grid is composed of discrete points in the abstract geometrical corresponding to numbers represented by an integer number of bits.

14. The memory medium of claim 1, wherein the family of systems comprises a family of computer programs in a specified programming language, wherein the parameters comprise a plurality of continuous parameters.

15. The memory medium of claim 14, wherein the computer programs comprise graphical data flow programs operable to perform one or more of:
   an industrial automation function;
   a process control function;
   a test and measurement function.

16. The memory medium of claim 1, wherein the family of systems comprises a first program and a plurality of automatically generated programs related to the first program; wherein the first point corresponds to the first program, and wherein distances between points representing the plurality of automatically generated programs and the first point are defined by deviations of respective output of the plurality of automatically generated programs with respect to output of the first program.

17. The memory medium of claim 16, wherein the program instructions are further executable to:
   automatically generate at least a subset of the plurality of programs based on said sampling of the abstract geometrical space;
   execute the first program and the automatically generated programs to generate respective outputs; and
   determine respective distance values for the automatically generated programs with respect to the first program based on the generated outputs.

18. The memory medium of claim 1, wherein the family of systems comprises a family of graphs, wherein the parameters comprise a plurality of continuous parameters.

19. The memory medium of claim 18, wherein the graphs comprise intermediate representations of corresponding programs.

20. A computer implemented method for approximating a system, the method comprising:
   storing a representation of a family of systems in a non-transitory computer memory, wherein the family of systems comprises models of corresponding real-world systems, wherein the family of systems comprises a family of filters of a specified order, wherein the representation of the family of systems comprises a plurality of parameters, and wherein the parameters comprise one or more of:

functional parameters of the models; or
representational parameters of the models;
determining an embedding of the family of systems into an abstract geometrical space with a metric, wherein the abstract geometrical space is continuous, wherein the abstract geometrical space is defined by the parameters, wherein at least some coordinates of the abstract geometrical space specify values for the parameters of systems of the family of systems, wherein the abstract geometrical space comprises a continuous space of the filters of the specified order, and wherein the abstract geometrical space comprises a grid of discrete points representing
respective discrete approximations of systems of the family of systems;
determining a first point in the abstract geometrical space corresponding to a desired instance of a system, wherein the coordinates of the first point specify values for the parameters of the desired instance of the system;
sampling the abstract geometrical space using a mapping of a well-distributed set of points from a Euclidean space of the parameters to the abstract geometrical space, wherein the mapping f-air-~maps the Euclidean space to the abstract geometrical space;
determining a nearest discrete point to the first point in the abstract geometrical space in accordance with the metric based on said sampling, wherein the nearest discrete point specifies values for parameters for an a substantially optimal discrete approximation of the desired instance of the system within a specified tolerance; and
storing the specified values for the discrete approximation, wherein the specified values of the parameters are useable to implement the discrete approximation of the desired instance of the system.

21. The method of claim 20, wherein the abstract geometrical space comprises one or more of:
a Euclidean space;
a non-Euclidean space;
a Riemannian manifold; or
a Finsler geometry.

22. The method of claim 20, wherein the filters comprise:
finite impulse response (FIR) filters; or
infinite impulse response (IIR) filters.

23. The method of claim 22, wherein the space of IIR filters comprises a Riemannian space, wherein the metric is induced by:

$$H(z) = \frac{\sum_{k=0}^{N} b_k z^{-k}}{1 + \sum_{j=1}^{M} a_j z^{-j}}$$

$$c^1 = (a_1^1, \ldots, a_M^1; b_0^1, \ldots, b_N^1),$$
$$c^2 = (a_1^2, \ldots, a_M^2; b_0^2, \ldots, b_N^2), \text{ and}$$

$$D(c^1, c^2) = \sqrt{\int_0^{2\pi} (|H_{(c^1)}(e^{i\phi})| - |H_{(c^2)}(e^{i\phi})|)^2 d\phi}$$

wherein H is a design system, $z=e^{i\phi}$, $\phi$ is an angle of a unit circle, N and M are orders of the numerator and denominator, and $a_j$, $b_k$ are reverse and forward coefficients, respectively, wherein the first point specifies a reference IIR filter with floating point coefficients, and wherein the grid points specify respective IIR filters with coefficients, wherein the coefficients have fixed point representations of respective specified precisions, wherein D represents a distance between system configurations $c^1$ and $c^2$, wherein a superscript of 1 denotes the first point specifying a first system configuration, and wherein a superscript of 2 denotes a second point specifying a second system configuration.

24. The method of claim 22, wherein the space of IIR filters comprises a Riemannian space of stable IIR filters, wherein the metric is induced by:

$$H(z) = \frac{\sum_{k=0}^{N} b_k z^{-k}}{1 + \sum_{j=1}^{M} a_j z^{-j}}$$

$$c^1 = (a_1^1, \ldots, a_M^1; b_0^1, \ldots, b_N^1),$$
$$c^2 = (a_1^2, \ldots, a_M^2; b_0^2, \ldots, b_N^2), \text{ and}$$

$$D(c^1, c^2) = \sqrt{\int_0^1 \int_0^{2\pi} (|H_{(c^1)}(re^{i\phi})| - |H_{(c^2)}(re^{i\phi})|)^2 d\phi dr},$$

wherein H is a design system, $z=e^{i\phi}$, $\phi$ is an angle of a unit disk, r is a radius of the unit disk, N and M are orders of the numerator and denominator, and $a_j$, $b_k$ are reverse and forward coefficients, respectively, wherein the first point specifies a reference IIR filter with floating point coefficients, and wherein the grid points specify respective IIR filters with coefficients having fixed point representations of respective specified precisions, wherein D represents a distance between system configurations $c^1$ and $c^2$ wherein a superscript of 1 denotes the first point specifying a first system configuration, and wherein a superscript of 2 denotes a second point specifying a second system configuration.

25. The method of claim 20, wherein the abstract geometrical space comprises:
a space of proportional/integral/derivative (PID) controllers;
a space of single input/single output (SISO) systems; or
a space of multi-input/multi-output (MIMO) systems.

26. The method of claim 20, wherein the abstract geometrical space comprises:
a space of functions with a finite set of continuous parameters.

27. The method of claim 20, wherein the abstract geometrical space comprises:
a continuous space of fixed point field sizes.

28. The method of claim 27, wherein distance in the continuous space of fixed point field sizes is augmented by resource constraints regarding the fixed point field sizes.

29. The method of claim 20, wherein the abstract geometrical space comprises continuous coordinates specifying numbers with a fractional number of bits, and wherein the grid is composed of discrete points in the abstract geometrical corresponding to numbers represented by an integer number of bits.

30. The method of claim 20, wherein the family of systems comprises a family of computer programs in a specified programming language, wherein the parameters comprise a plurality of continuous parameters.

31. The method of claim 20, wherein the family of systems comprises a first program and a plurality of automatically generated programs related to the first program; wherein the first point corresponds to the first program, and wherein distances between points representing the plurality of automatically generated programs and the first point are defined by deviations of respective output of the plurality of automatically generated programs with respect to output of the first program.

32. The method of claim 31, wherein the method further comprises:

automatically generating at least a subset of the plurality of programs based on said sampling of the abstract geometrical space;

executing the first program and the automatically generated programs to generate respective outputs; and determining respective distance values for the automatically generated programs with respect to the first program based on the generated outputs.

33. The method of claim 20, wherein the family of systems comprises a family of graphs, wherein the parameters comprise a plurality of continuous parameters.

34. The method of claim 33, wherein the graphs comprise intermediate representations of corresponding programs.

* * * * *

UNITED STATES PATENT AND TRADEMARK OFFICE
CERTIFICATE OF CORRECTION

PATENT NO. : 8,364,446 B2
APPLICATION NO. : 12/577357
DATED : January 29, 2013
INVENTOR(S) : James M. Lewis et al.

It is certified that error appears in the above-identified patent and that said Letters Patent is hereby corrected as shown below:

In the Claims:

In Column 23, line 64, insert -- , -- after $c^1$ and $c^2$.

In Column 26, line 35, insert -- , -- after $c^2$.

Signed and Sealed this
Sixteenth Day of April, 2013

Teresa Stanek Rea
*Acting Director of the United States Patent and Trademark Office*